United States Patent
Horng et al.

(10) Patent No.: US 9,093,494 B2
(45) Date of Patent: Jul. 28, 2015

(54) GUARD STRUCTURE FOR SEMICONDUCTOR STRUCTURE AND METHOD OF FORMING GUARD LAYOUT PATTERN FOR SEMICONDUCTOR LAYOUT PATTERN

(71) Applicant: Taiwan Semiconductor Manufacturing Company, Ltd., Hsinchu (TW)

(72) Inventors: Jaw-Juinn Horng, Hsinchu (TW); Jen-Hao Yeh, Kaohsiung (TW); Fu-Chih Yang, Kaohsiung (TW); Chung-Hui Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 31 days.

(21) Appl. No.: 13/781,615

(22) Filed: Feb. 28, 2013

(65) Prior Publication Data

US 2014/0239450 A1 Aug. 28, 2014

(51) Int. Cl.

| H01L 21/70 | (2006.01) |
|---|---|
| H01L 21/76 | (2006.01) |
| H01L 29/02 | (2006.01) |
| H01L 29/06 | (2006.01) |

(52) U.S. Cl.
CPC ............. *H01L 21/76* (2013.01); *H01L 29/02* (2013.01); *H01L 29/0623* (2013.01); *H01L 29/0619* (2013.01)

(58) Field of Classification Search
None
See application file for complete search history.

(56) References Cited

U.S. PATENT DOCUMENTS

| 8,643,104 | B1 * | 2/2014 | Liao et al. ...................... 257/343 |
|---|---|---|---|
| 2002/0130332 | A1 * | 9/2002 | Cho et al. ........................ 257/147 |
| 2006/0043528 | A1 * | 3/2006 | Ren et al. ........................ 257/565 |
| 2013/0093017 | A1 * | 4/2013 | Ko ................................. 257/343 |
| 2014/0138735 | A1 * | 5/2014 | Clarke et al. ................... 257/124 |

* cited by examiner

*Primary Examiner* — Khaja Ahmad
(74) *Attorney, Agent, or Firm* — McDermott Will & Emery LLP

(57) ABSTRACT

A guard structure for a semiconductor structure is provided. The guard structure includes a first guard ring, a second guard ring and a third guard ring. The first guard ring has a first conductivity type. The second guard ring has a second conductivity type, and surrounds the first guard ring. The third guard ring has the first conductivity type, and surrounds the second guard ring, wherein the first, the second and the third guard rings are grounded. A method of forming a guard layout pattern for a semiconductor layout pattern is also provided.

20 Claims, 15 Drawing Sheets

GUARD STRUCTURE FOR SEMICONDUCTOR STRUCTURE AND METHOD OF FORMING GUARD LAYOUT PATTERN FOR SEMICONDUCTOR LAYOUT PATTERN

TECHNICAL FIELD

The present disclosure relates to a guard structure, and more particularly to a guard structure for a semiconductor structure.

BACKGROUND

A power converter is classified as a switched-mode power supply, a rectifier, a power inverter, a motor-generator set, a DC-to-DC converter, or a transformer. A typical power converter includes a switching circuit, a driver and a low-voltage circuit. For an application of the typical power converter, the designer may make distance separating the driver and the low-voltage circuit as large as possible to reduce noise coupling from the driver to the low-voltage circuit. Increasing the distance can improve the isolation between the driver and the low-voltage circuit.

SUMMARY

In accordance with one aspect of the present disclosure, a method of forming a guard layout pattern for a semiconductor layout pattern including a device region is provided. The method includes the following steps. A first guard ring is formed in the guard layout pattern around the device region. A parameter formed through an interaction of the first guard ring and the device region is obtained. Whether the guard layout pattern needs an additional guard ring is determined based on the parameter.

In accordance with another aspect of the present disclosure, a guard structure for a semiconductor structure is provided. The guard structure includes a first guard ring, a second guard ring and a third guard ring. The first guard ring has a first conductivity type. The second guard ring has a second conductivity type, and surrounds the first guard ring. The third guard ring has the first conductivity type, and surrounds the second guard ring, wherein the first, the second and the third guard rings are grounded.

In accordance with one more aspect of the present disclosure, a guard structure for a semiconductor structure is provided. The guard structure includes a first guard ring, a second guard ring and a third guard ring. The first guard ring has a first conductivity type. The second guard ring has a second conductivity type, and surrounds the first guard ring. The third guard ring has the first conductivity type, and surrounds the second guard ring, wherein the first, the third guard ring is grounded.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
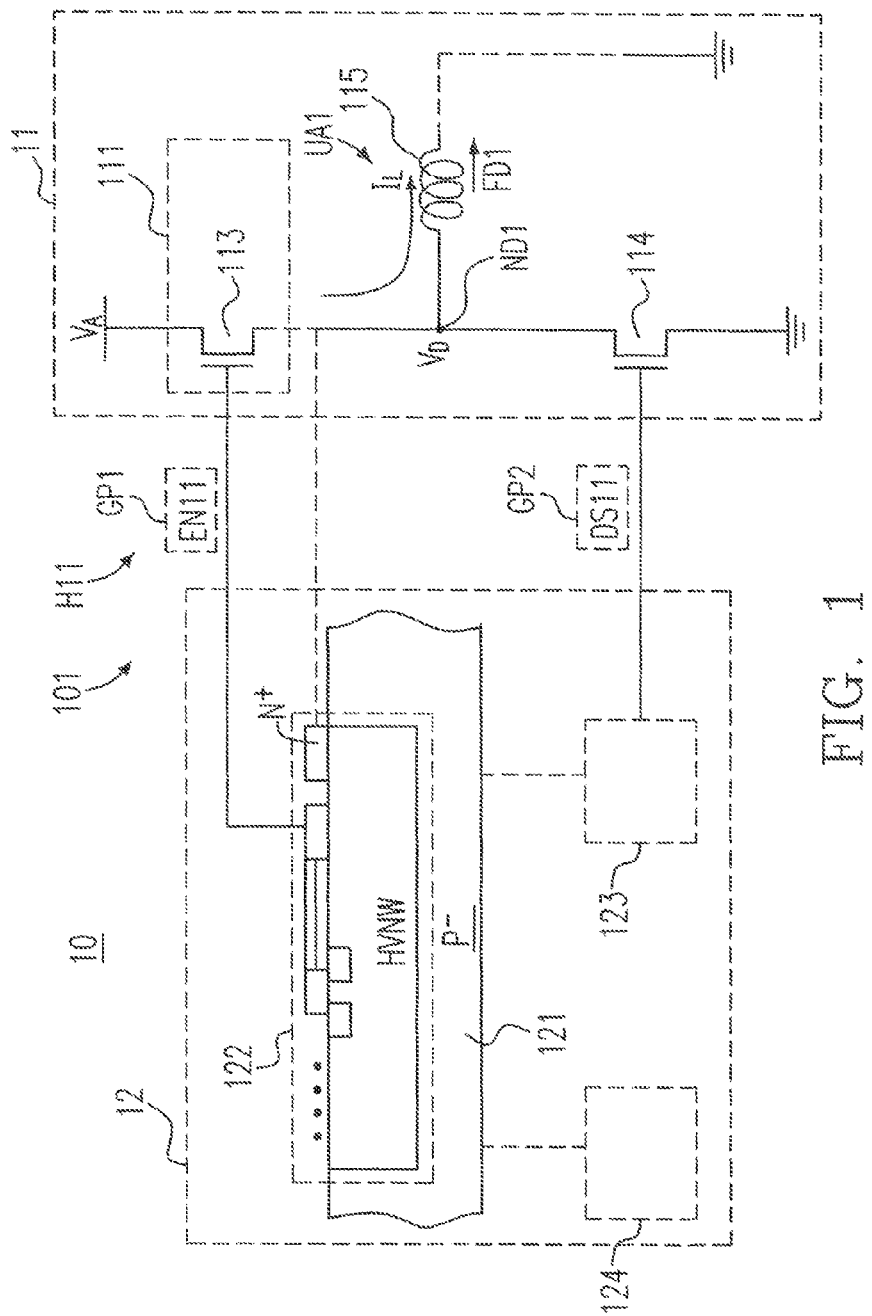
FIG. 1 is a schematic diagram showing a first configuration of a power converter in a state in accordance with various embodiments of the present disclosure.

FIG. 1 is a schematic diagram showing a first configuration 101 of a power converter 10 in a state H11 in accordance with various embodiments of the present disclosure. The power converter 10 in the state H11 includes a conversion unit 11 and a control circuit 12 controlling the conversion unit 11. The conversion unit 11 includes a device 111, a switch 114, a node ND1 and an inductor 115. For instance, the device 111 can be an internal device or an external device (such as exterior to the conversion unit 11 and the switch 114), and includes a switch 113 receiving a bias voltage $V_A$. For instance, the switch 113 is a high-side switch; the switch 114 is a low-side switch; and the node ND1 is electrically connected to the inductor 115 and the switches 113 and 114. For instance, the bias voltage $V_A$ is a supply voltage; and the switches 113 and 114 are two N-type metal-oxide-semiconductor (MOS) transistors, respectively.

The control circuit 12 includes a P$^-$-type semiconductor substrate 121, drivers 122 and 123, and a low-voltage circuit 124, wherein each of the low-voltage circuit 124 and the drivers 122 and 123 may be coupled to the P$^-$-type semiconductor substrate 121. The drivers 122 and 123 are a high-side pre-driver and a low-side pre-driver, respectively, and provide drive signals GP1 and GP2 to the switches 113 and 114, respectively. For instance, the drive signals GP1 and GP2 are two gate drive signals. The conversion unit 11 generates an inductor current $I_L$ in response to the drive signals GP1 and GP2. The inductor current $I_L$ flows through the inductor 115 and has a flow direction UA1, which has a forward direction FD1 in the state H11. In the state H11, the drive signal GP1 has an enable level EN11 (such as a high voltage level), and the drive signal GP2 has a disable level DS11 (such as a low voltage level). The switch 113 is turned on in response to the enable level EN11, and the switch 114 is turned off in response to the disable level DS11.

Figure 2:
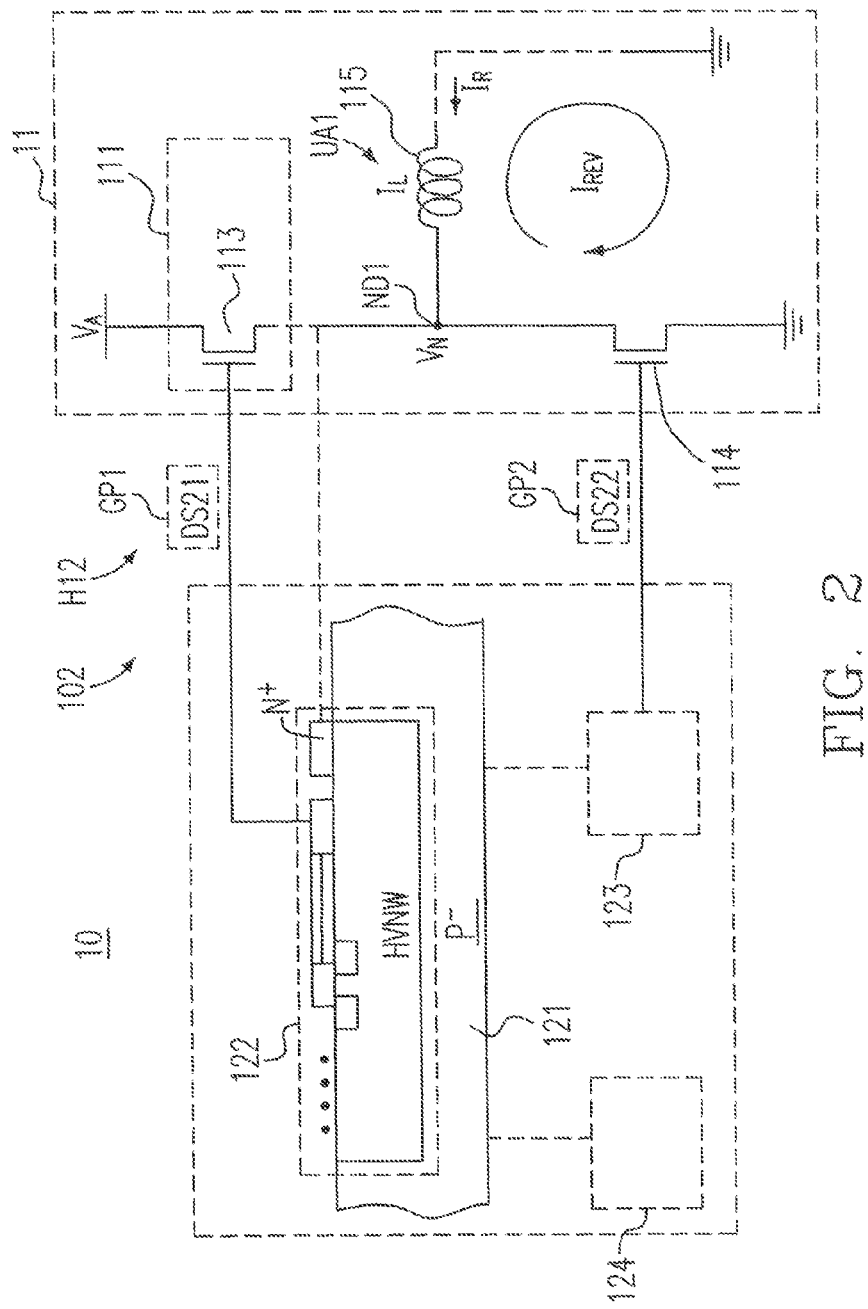
FIG. 2 is a schematic diagram showing a second configuration of the power converter in a state in accordance with various embodiments of the present disclosure.

FIG. 2 is a schematic diagram showing a second configuration 102 of the power converter 10 in a state H12 in accordance with various embodiments of the present disclosure. In the state H12, the drive signals GP1 and GP2 have disable levels DS21 and DS22 (such as two low voltage levels), respectively. The switch 113 is turned off in response to the disable level DS21, and the switch 114 is not yet turned on; hence, the switch 114 is turned off in response to the disable level DS22. In order to keep the inductor current $I_L$ constant, the conversion unit 11 can generate a reverse current $I_R$ from the ground to the node ND1. Therefore, the node voltage $V_D$ develops to form a negative voltage $V_N$ at the node ND1, wherein the state H12 may be a reverse-current state.

Figure 3:
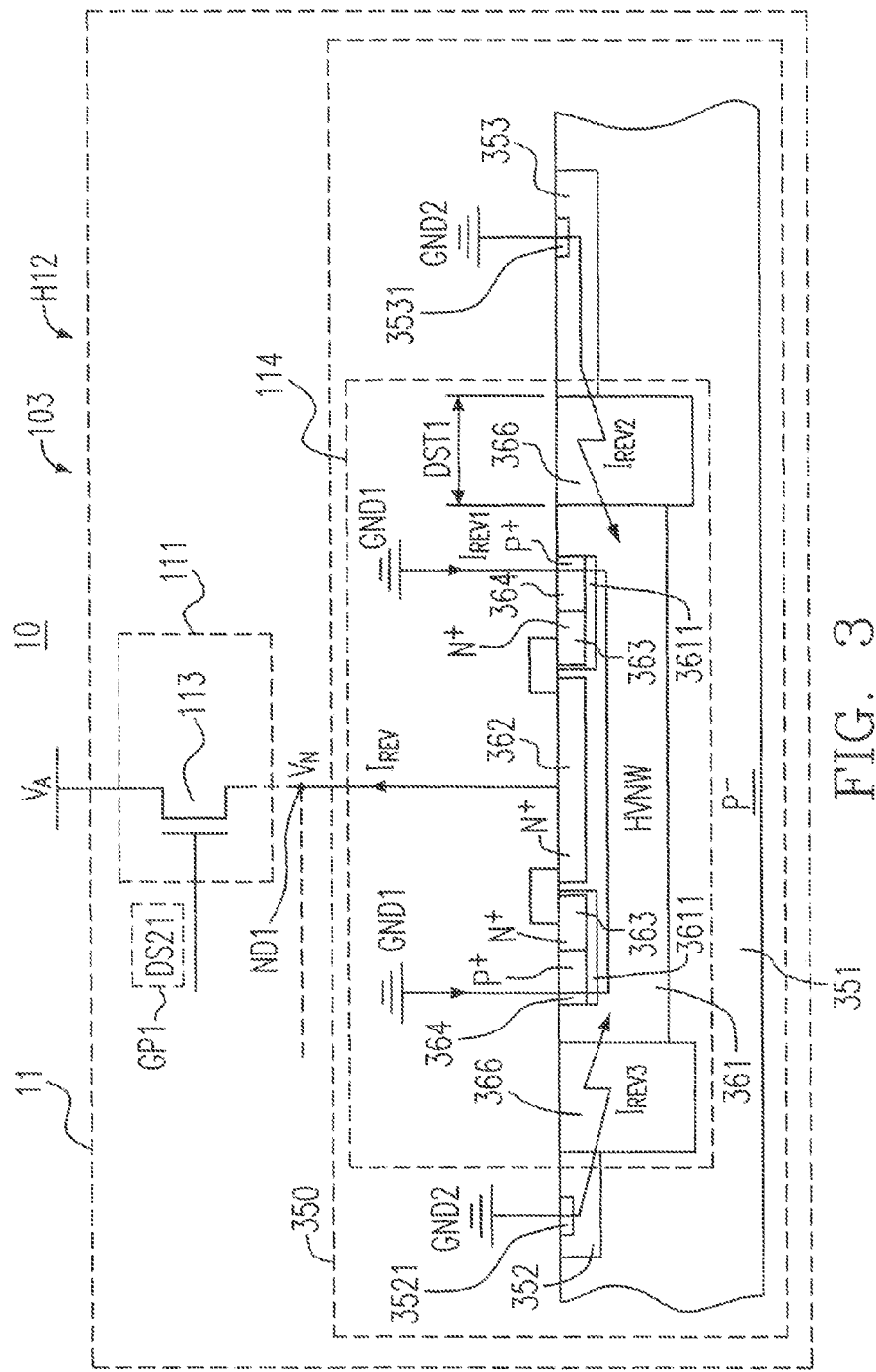
FIG. 3 is a schematic diagram showing a third configuration of the power converter in the state in FIG. 2.

FIG. 3 is a schematic diagram showing a third configuration 103 of the power converter 10 in the state H12 in FIG. 2. The power converter 10 in the state H12 includes the conversion unit 11. The conversion unit 11 includes the device 111 and a semiconductor structure 350. The semiconductor structure 350 includes a P⁻-type semiconductor substrate 351, the switch 114, and additional circuit regions 352 and 353. Each of the switch 114 and the additional circuit regions 352 and 353 is disposed in the P⁻-type semiconductor substrate 351; the switch 114 is coupled to the additional circuit regions 352 and 353; and the additional circuit regions 352 and 353 include coupling points 3521 and 3531, respectively. For instance, the P⁻-type semiconductor substrate 351 may be coupled to the P⁻-type semiconductor substrate 121 in FIG. 2.

The switch 114 in FIG. 3 includes a high-voltage N-type well region 361, a low-voltage P-type well region 3611, an N⁺-type drain region 362, an N⁺-type source region 363, a P⁺-type pick-up region 364 and a substrate block 366. The N⁺-type drain region 362 is disposed in the high-voltage N-type well region 361, and transmits the current $I_{REV}$ to the node ND1 having the negative voltage $V_N$. The N⁺-type source region 363 is disposed in the low-voltage P-type well region 3611. The P⁺-type pick-up region 364 is disposed in the low-voltage P-type well region 3611, and is connected to the N⁺-type source region 363 and the ground GND1.

The semiconductor structure 350 has an isolation distance DST1 between the high-voltage N-type well region 361 and either of the additional circuit regions 352 and 353. The coupling points 3521 and 3531 are coupled to the ground GND2, which serves as the ground reference of the additional circuit regions 352 and 353, wherein the additional circuit regions 352 and 353 are coupled to the substrate block 366.

The current $I_{REV}$ includes coupling current components $I_{REV1}$, $I_{REV2}$ and $I_{REV3}$. Separate ground references (such as the separate grounds GND1 and GND2) are disposed to cause the most coupling current (such as the coupling current component $I_{REV1}$) of the current $I_{REV}$ to be come from the ground GND1 and to minimize the coupling current components $I_{REV2}$ and $I_{REV3}$ of the ground GND2. The coupling current component $I_{REV1}$ flows from the ground GND1 to the high-voltage N-type well region 361 through the P⁺-type pick-up region 364. The coupling current components $I_{REV2}$ and $I_{REV3}$ flow from the ground GND2 to the high-voltage N-type well region 361 through the additional circuit regions 152 and 153 and the substrate block 366, and may be measured between the ground GND2 and the additional circuit regions 352 and 353. For instance, the coupling points 3521 and 3531 are used for measurements to the coupling current components $I_{REV2}$ and $I_{REV3}$, respectively.

Figure 4:
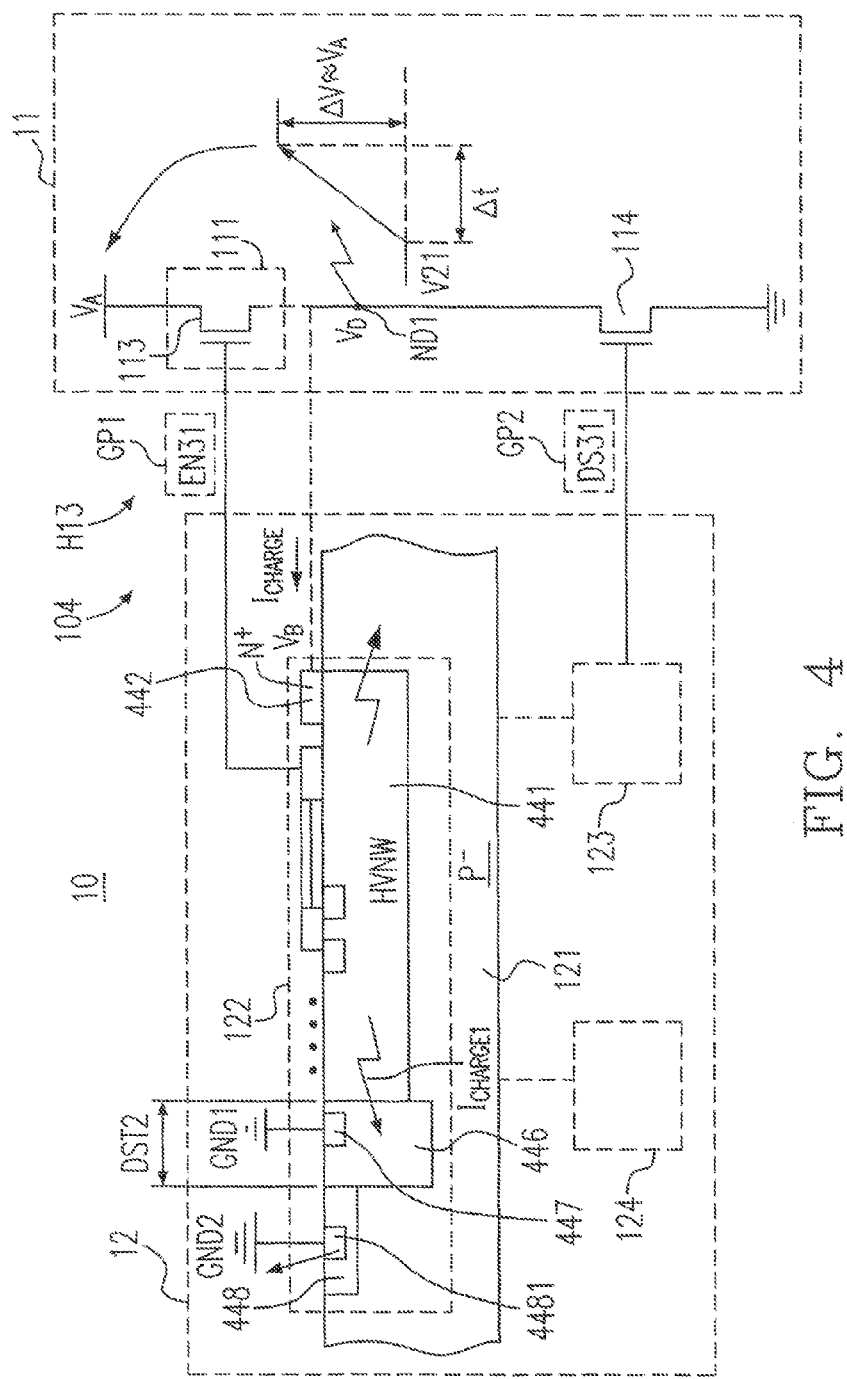
FIG. 4 is a schematic diagram showing a fourth configuration of the power converter in a state in accordance with various embodiments of the present disclosure.

FIG. 4 is a schematic diagram showing a fourth configuration 104 of the power converter 10 in a state H13 in accordance with various embodiments of the present disclosure. In the fourth configuration 104, the driver 122 of the power converter 10 includes a high-voltage N-type well region 441, an N⁺-type pick-up region 442, a substrate block 446, a P⁺-type pick-up region 447 and an additional circuit region 448. The substrate block 446 is disposed in the P⁻-type semiconductor substrate 121, surrounds the high-voltage N-type well region 441, and has an isolation distance DST2 between the high-voltage N-type well region 441 and the additional circuit region 448. The additional circuit region 448 includes a coupling point 4481, is disposed in the P⁻-type semiconductor substrate 121, and is coupled to the substrate block 446.

The driver 122 is a bootstrap high-side driver, and the N⁺-type pick-up region 442 receives a bootstrap voltage $V_B$. The power converter 10 may change the bootstrap voltage $V_B$ in response to the drive signals GP1 and GP2. During portions of each switching cycle, when the switch 113 conducts, the bootstrap voltage $V_B$ may drop due to an energy consumption associated with the bootstrap voltage $V_B$. During alternating portions of the switching cycle, when the switch 114 conducts, the node voltage $V_D$ has a voltage level V21 close to the ground voltage and the bootstrap voltage $V_B$ is increased to a voltage level V11 due to energy storage. The charge path of the energy storage may pass through the node ND1 and the switch 114.

In the state H13, the drive signal GP1 has an enable level EN31 (such as a high voltage level) for turning on the switch 113, and the drive signal GP2 has a disable level DS31 (such as a low voltage level) for turning off the switch 114. When the switch 113 is turned on, the node voltage $V_D$ is increased from the voltage level V21 (close to the ground voltage, since the switch 114 was previously turned on) to approach the bias voltage $V_A$. As this occurs, the bootstrap voltage $V_B$, being referenced to the node voltage $V_D$, is also increased so as to have a voltage level V12 greater than the bias voltage $V_A$ by approximately the voltage level V11; that is, the bootstrap voltage $V_B$ has a voltage increase $\Delta V$ from the voltage level V11 to the voltage level V12 in a period $\Delta t$ in the state H13. In the state H13, the control circuit 12 receives the bootstrap voltage $V_B$ to cause the N⁺-type pick-up region 442 to equivalently receive a current $I_{CHARGE}$, wherein the state H13 may be a charge-current state.

The current $I_{CHARGE}$ includes a coupling current component $I_{CHARGE1}$. The P⁺-type pick-up region 447 surrounds the high-voltage N-type well region 441, and is electrically connected to the ground GND1. Most of the current $I_{CHARGE}$ is absorbed by the P⁺-type pick-up region 447. However, the coupling current component $I_{CHARGE1}$ can flow from the high-voltage N-type well region 441 to the ground GND2 through the substrate block 446 and the additional circuit region 448, and may be measured between the ground GND2 and the additional circuit region 448. For instance, the ground GND2 serves as a ground reference of the additional circuit region 448, and is electrically connected to the coupling point 4481, wherein the coupling point 4481 is used for a measurement to the coupling current component $I_{CHARGE1}$.

The noise-coupling path is near to the surface of the semiconductor substrate 121 or 351. Because the surface of the semiconductor substrate 121 or 351 is highly doped and has low resistivity for the circuit ground pick-up, the power converter 10 may need a large separation distance between the noise source and the sensitive circuit in order to reduce the noise coupling.

Figure 5A:
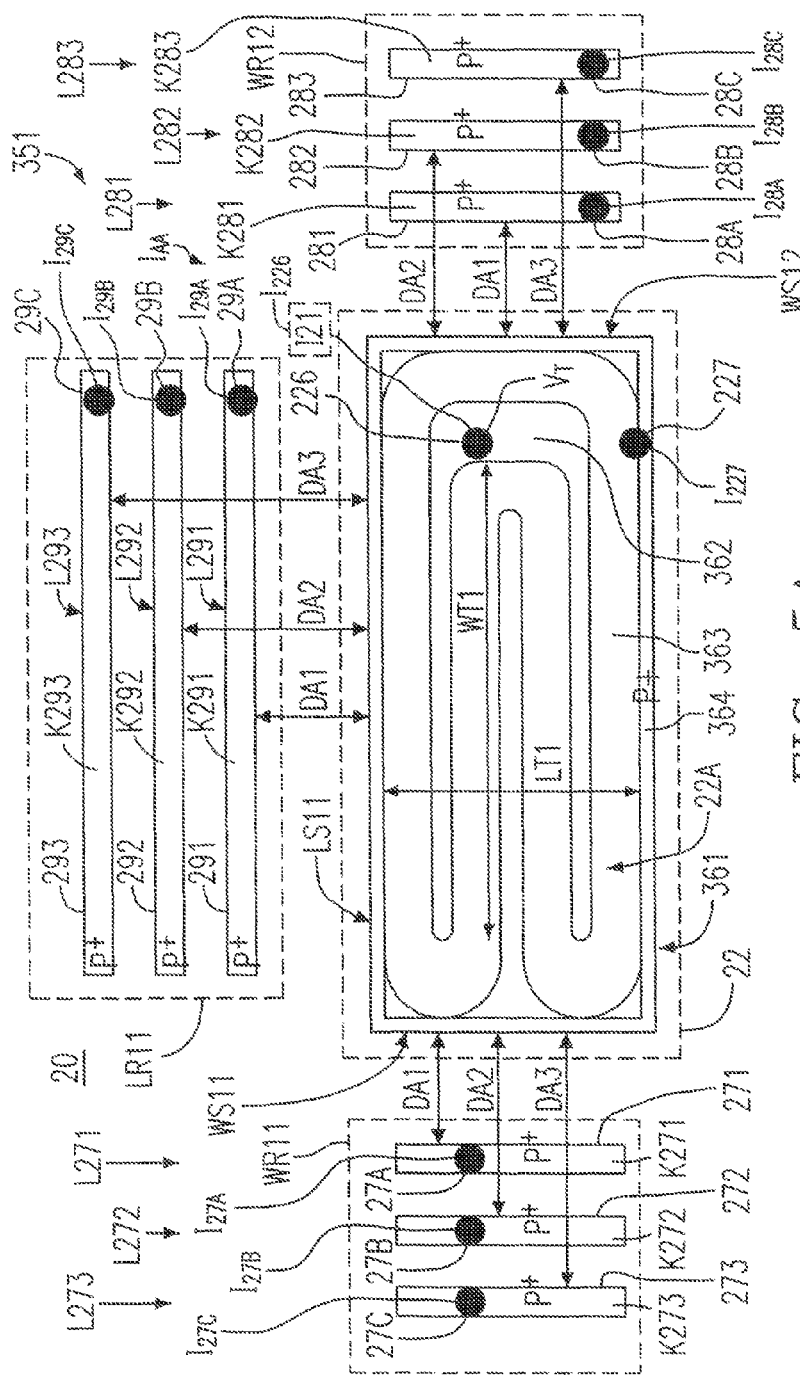
FIG. 5A and FIG. 5B are schematic diagrams showing a top view and a front cross-sectional view of a testing pattern structure for obtaining a current relationship in FIG. 3 in accordance with various embodiments of the present disclosure.
Figure 5B:
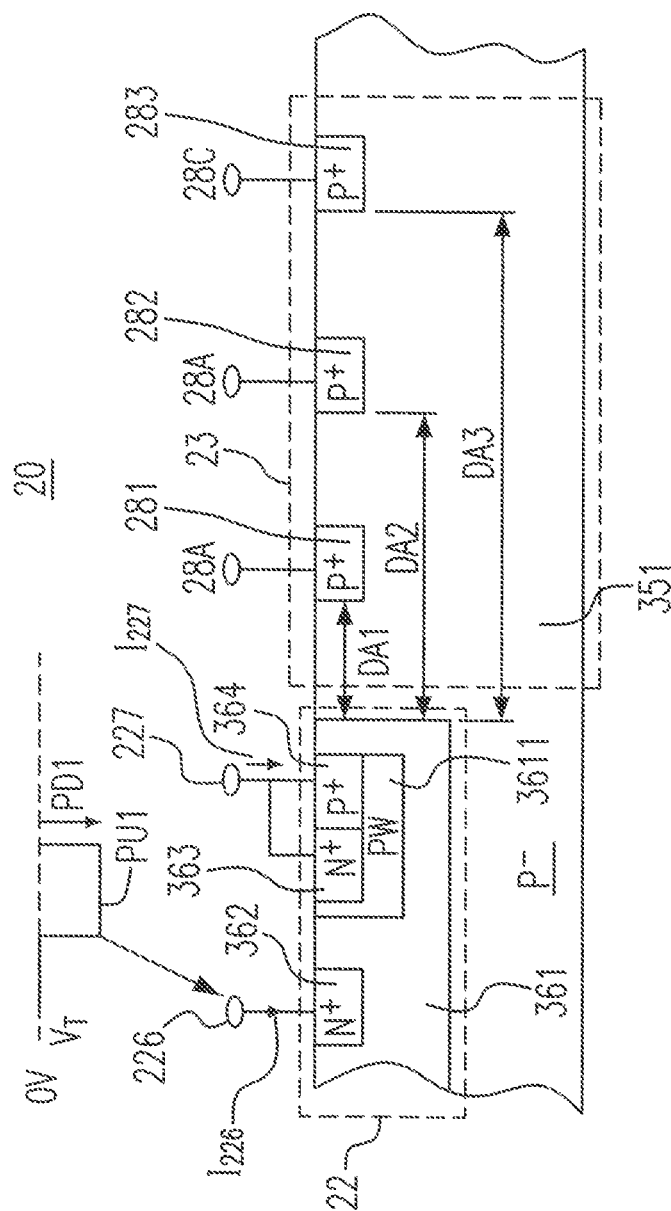

FIG. 5A and FIG. 5B are schematic diagrams showing a top view and a front cross-sectional view of a testing pattern structure 20 for obtaining a current relationship in FIG. 3 according to various embodiments of the present disclosure. FIG. 5A and FIG. 5B show the testing pattern structure 20 of the semiconductor structure 350 in FIG. 3. The testing pattern structure 20 includes a P$^-$-type semiconductor substrate 351, a device region 22 and a guard structure 23. The device region 22 is coupled to the P$^-$-type semiconductor substrate 351, and is similar to the switch 114 in FIG. 3. The testing pattern structure 20 is configured to obtain the current relationship among the current $I_{REV}$, and the coupling current components $I_{REV1}$, $I_{REV2}$ and $I_{REV3}$ as shown in FIG. 3.

In some embodiments, the device region 22 includes a high-voltage N-type well region 361, an N$^+$-type drain region 362, a P-type well region 3611, an N$^+$-type source region 363, a P$^+$-type pick-up region 364, a drain terminal 226 and a source terminal 227. The high-voltage N-type well region 361 is disposed in the P$^-$-type semiconductor substrate 351. Each of the N$^+$-type drain region 363 and the P-type well region 3611 is disposed in the high-voltage N-type well region 361. The N$^+$-type source region 363 is disposed in the P-type well region 3611. The P$^+$-type pick-up region 364 is disposed in the P-type well region 3611, is coupled to the N$^+$-type source region 363, and surrounds the high-voltage N-type well region 361. The drain terminal 226 is electrically connected to the N$^+$-type drain region 362. The source terminal 227 is electrically connected to the N$^+$-type source region 363 and the P$^-$-type pick-up region 364.

In some embodiments, the device region 22 has a device size 22A, which has a length LT1 and a width WT1. For instance, the length LT1 is about 1000 µm, and the width WT1 is about 500 µm, respectively. The device region 22 further has a widthwise side WS11, a widthwise side WS12 opposite to the widthwise side WS12, and a lengthwise side LS11. For instance, the widthwise sides WS11 and WS12 are laid out with different patterns.

In some embodiments, the guard structure 23 surrounds the device region 22, and includes a widthwise region WR11, a widthwise region WR12 opposite to the widthwise region WR12 and a lengthwise region LR11 with respect to the device region 22. Each of the widthwise regions WR11 and WR12 and the lengthwise region LR11 is located in the P$^-$-type semiconductor substrate 21; and the widthwise regions WR11 and WR12 and the lengthwise region LR11 are disposed based on the widthwise sides WS11 and WS12 and the lengthwise side LS11, respectively.

In some embodiments, the guard structure 23 further includes P$^+$-type pick-up regions 271, 272, 273, 281, 282, 283, 291, 292 and 293, and pick-up terminals 27A, 27B, 27C, 28A, 28B, 28C, 29A, 29B and 29C. In some embodiments, the P$^+$-type pick-up regions 271, 272, 273, 281, 282, 283, 291, 292 and 293 have positions K271, K272, K273, K281, K282, K283, K291, K292 and K293, respectively. In some embodiments, the pick-up terminals 27A, 27B, 27C, 28A, 28B, 28C, 29A, 29B and 29C are electrically connected to the P$^+$-type pick-up regions 271, 272, 273, 281, 282, 283, 291, 292 and 293, respectively. For instance, the drain terminal 226, the source terminal 227 and the pick-up terminals 27A, 27B, 27C, 28A, 28B, 28C, 29A, 29B and 29C serve as testing points, respectively.

In some embodiments, the P$^+$-type pick-up regions 271, 272 and 273 are disposed in the widthwise region WR11 at respective distances DA1, DA2 and DA3 from the widthwise side WS11. The P$^+$-type pick-up regions 281, 282 and 283 are disposed in the widthwise region WR12 at the respective distances DA1, DA2 and DA3 from the widthwise side WS12. The P$^+$-type pick-up regions 291, 292 and 293 are disposed in the lengthwise region LR11 at the respective distances DA1, DA2 and DA3 from the lengthwise side LS11.

In some embodiments, the drain terminal 226 receives a testing supply voltage $V_T$, the source terminal 227 is coupled to the ground GND1, and the pick-up terminals 27A, 27B, 27C, 28A, 28B, 28C, 29A, 29B and 29C are coupled to the ground GND1/GND2 or a mixed ground configuration of the grounds GND1 and GND2. For instance, the testing supply voltage $V_T$ causes the drain terminal 226 to equivalently receive a current $I_{226}$, and includes an inverted pulse PU1, which has a pulse depth PD1. For instance, the pulse depth PD1 has a voltage level of −1 V. The semiconductor structure 20 generates currents $I_{227}$, $I_{27A}$, $I_{27B}$, $I_{27C}$, $I_{28A}$, $I_{28B}$, $I_{28C}$, $I_{29A}$, $I_{29B}$ and $I_{29C}$ from the respective P$^+$-type pick-up regions 271, 272, 273, 281, 282, 283, 291, 292 and 293 in response to the current $I_{226}$, thereby forming attenuations L271, L272, L273, L281, L282, L283, L291, L292 and L293 about the respective positions K271, K272, K273, K281, K282, K283, K291, K292 and K293.

In some embodiments, the current $I_{226}$ is adjusted to reach a current level $I_{21}$ in a specific current range I. For instance, a level of the current $I_{226}$ is close to a level of the currents $I_{227}$; the current $I_{226}$ is a sink signal, which flows from the source terminal 227 to the drain terminal 226; and the specific current range $I_{AA}$ has a nominal current value of 100 mA. When the current $I_{226}$ reaches the current level $I_{21}$ in the specific current range $I_{AA}$, the currents $I_{226}$, $I_{227}$, $I_{27A}$, $I_{27B}$, $I_{27C}$, $I_{28A}$, $I_{28B}$, $I_{28C}$, $I_{29A}$, $I_{29B}$ and $I_{29C}$ are measured or analyzed to determine the attenuations L271, L272, L273, L281, L282, L283, L291, L292 and L293. In some embodiments, because the level of the current $I_{226}$ is close to the level of the current $I_{227}$, the attenuation L271 is determined according to a formula of $20 \cdot \log(I_{27A}/I_{227})$ or according to a formula of $20 \cdot \log(I_{27A}/I_{226})$, the attenuation L272 is determined according to a formula of $20 \cdot \log(I_{27B}/I_{227})$ or according to a formula of $20 \cdot \log(I_{27B}/I_{226})$, and the other attenuations are determined similarly.

Figure 6:
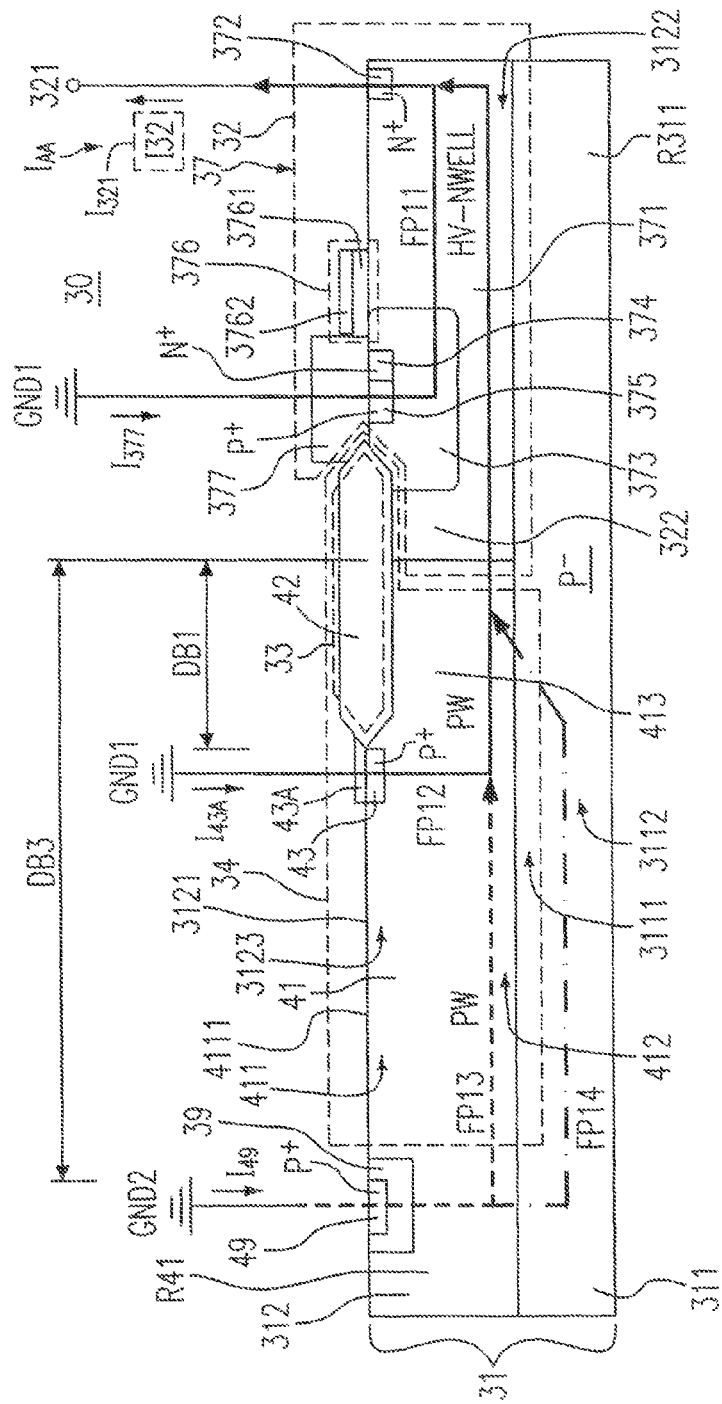
FIG. 6 is a schematic diagram showing a semiconductor structure in accordance with various embodiments of the present disclosure.

FIG. 6 is a schematic diagram showing a semiconductor structure 30 in accordance with various embodiments of the present disclosure. The semiconductor structure 30 includes a semiconductor substrate 31, a device region 32, a guard structure 34 and a circuit region 39, wherein each of the device region 32, the guard structure 34 and the circuit region 39 is coupled to or disposed in the semiconductor substrate 31. The semiconductor substrate 31 includes a first conductivity type, a substrate layer 311 and an epitaxial layer 312 disposed over the substrate layer 311. The substrate layer 311 includes the first conductivity type, a top portion 3111 and a portion 3112 below the top portion 3111. The epitaxial layer 312 includes the first conductivity type, a top surface 3121, a bottom portion 3122 coupled to the top portion 3111, and a top portion 3123 including the top surface 3121. For instance, the first conductivity type is a P type, and the substrate layer 311 is lightly doped. The device region 32 is disposed in the semiconductor substrate 31, and is surrounded by the guard structure 34.

The device region 32 is a specific region 37, and includes a specific terminal 321. The specific region 37 includes a high-voltage well region 371, a drain region 372, a body region 373, a source region 374, a pick-up region 375, a gate structure 376 and a contact 377. The high-voltage well region 371 has a second conductivity type, and is disposed in the semiconductor substrate 31. For instance, the high-voltage well region 371 extends downward from the top surface 3121 to the bottom portion 3122; and the second conductivity type is an N type. The drain region 372 has the second conductivity type, is disposed in the high-voltage well region 371, and is electrically connected to the specific terminal 321. For instance, the drain region 372 is heavily doped (such as doped heavier than the high-voltage well region 371).

The body region 373 has the first conductivity type, and is disposed in the high-voltage well region 371. The source region 374 has the second conductivity type, and is disposed in the body region 373. For instance, the source region 374 is heavily doped, and is doped heavier than the body region 373. The pick-up region 375 has the first conductivity type, is disposed in the body region 373, and is coupled to the source region 374. For instance, the pick-up region 375 is heavily doped, and is doped heavier than the body region 373.

The gate structure 376 is disposed over a portion of the body region 373 and a portion of the high-voltage well region 371. The contact 377 is electrically connected to the source region 374 and the pick-up region 375. The gate structure 376 includes a gate insulating film 3761 and a gate electrode 3762. The gate insulating film 3761 is disposed over a portion of the body region 373 and a portion of the high-voltage well region 371. The gate electrode 3762 is disposed over the gate insulating film 3761. For instance, the first conductivity type is an N type, and the second conductivity type is a P type.

The guard structure 34 includes a doped well region 41, an isolation structure 33, a guard ring 43 and a contact 43A. The doped well region 41 is disposed in the semiconductor substrate 31, is coupled to the device region 32, and includes the first conductivity type, a top portion 411 and a bottom portion 412, wherein the top portion 411 has a top surface 4111. For instance, the doped well region 41 extends downward from the top surface 3121 to the bottom portion 3122; and the bottom portion 412 is coupled to the top portion 3111 of the substrate layer 311.

The isolation structure 33 includes a dielectric region 42. The dielectric region 42 is disposed over a portion 413 of the doped well region 41 and a portion 322 of the device region 32. For instance, the dielectric region 42 may surround the device region 32, and be a field dielectric region or a trench dielectric region.

The guard ring 43 is coupled to the dielectric region 42, has the first conductivity type, and surrounds the device region 32. For instance, the guard ring 43 serves as a pick-up region, is heavily doped, is disposed in the top portion 411 at a predetermined distance DB1 from the device region 32, and completely surrounds the device region 32. For instance, the guard ring 43 completely surrounds the dielectric region 42. The guard ring 43 is electrically connected to the pick-up region 375 and the ground GND1.

The circuit region 39 is outside the guard structure 34, and includes a pick-up region 49. For instance, the circuit region 39 is a low-power circuit region, and is similar to one of the additional circuit regions 352 and 353 shown in FIG. 3. The pick-up region 49 is outside the guard ring 43, has the first conductivity type, and is disposed in the top portion 411 at a predetermined distance DB3 from the device region 32. The contact 43A is in contact with the guard ring 43. For instance, the doped well region 41 has a sheet resistance R41 of 1972 Ohm/sq, and the substrate layer 311 has a sheet resistance R311 of 8000 Ohm/sq. Each of the contact 377 and the contact 43A is coupled to the ground GND1, and the pick-up region 49 is coupled to the ground GND2. The ground GND2 may be a low-voltage ground and serve as a ground reference of the additional low-power circuit region as shown in FIG. 3. It is desirable to configure the semiconductor structure 30 to have the current relationship $((I_{377}+I_{43A})>>I_{49})$ in order that most coupling current of the current $I_{321}$ comes from the ground GND1 but not from the ground GND2. Configuring the current relationship $((I_{377}+I_{43A})>>I_{49})$ in the semiconductor structure 30 can reduce the coupling current noise entering the circuit region 39, wherein the circuit region 39 is electrically connected to the ground GND2.

The specific terminal 321 of the device region 32 receives a current $I_{321}$. For instance, the current $I_{321}$ is a flow-out current, and has a current level 132 in a specific current range $I_{AA}$, wherein the specific current range $I_{AA}$ has a nominal current value of 100 mA. The semiconductor structure 30 generates currents $I_{377}$, $I_{43A}$ and $I_{49}$ from respectively the contact 377, the contact 43A and the pick-up region 49 in response to the current $I_{321}$. For instance, the currents $I_{377}$, $I_{43A}$ and $I_{49}$ are flow-in currents, respectively.

The currents $I_{321}$, $I_{377}$, $I_{43A}$ and $I_{49}$ have a relationship of $(I_{377}+I_{43A}+I_{49}=I_{321})$ (e.g., $I_{321}=100$ mA). The semiconductor structure 30 may serve as the switch 114 of the power converter 10 in FIG. 2. In order to prevent the substrate noise (e.g., resulting from the reverse current) of the semiconductor structure 30 in FIG. 6, the semiconductor structure 30 is configured to cause the current $I_{49}$ to be as small as possible. Under the condition that the sheet resistance R311 of the substrate layer 311 is greater than the sheet resistance R41 of the doped well region 41, the currents $I_{377}$, $I_{43A}$ and $I_{49}$ have the flow paths FP11, FP12 and FP13, respectively. The layout of the semiconductor structure 30 can include two grounds GND1 and GND2, which serve as two ground references respectively. The current $I_{49}$ can be measured from the ground GND2; and the current $(I_{377}+I_{43A})$ can be measured from the ground GND1. Because the current relationship $((I_{377}+I_{43A})>>I_{49})$ is configured in the semiconductor structure 30, an attenuation L49 for a position of the pick-up region 49 may be determined according to a formula of $20\cdot\log(I_{49}/(I_{377}+I_{43A}))$ or according to a formula of $20\cdot\log(I_{49}/I_{321})$.

The flow path FP11 runs from the ground GND1 to the specific terminal 321 through the contact 377, the pick-up region 375, the body region 373, the high-voltage well region 371 and the drain region 372. The flow path FP12 runs from the ground GND1 to the specific terminal 321 through the contact 43A, the guard ring 43, the doped well region 41, the high-voltage well region 371 and the drain region 372. The flow path FP13 runs from the ground GND2 to the specific terminal 321 through the pick-up region 49, the doped well region 41, the high-voltage well region 371 and the drain region 372.

In some embodiments of the present disclosure, in order to further reduce the current $I_{49}$, the semiconductor structure 30 may be further configured to change the flow path FP13 into a flow path FP14, wherein the flow path FP14 runs from the ground GND2 to the specific terminal 321 through the pick-up region 49, the doped well region 41, the substrate layer 311, the high-voltage well region 371 and the drain region 372. Because the sheet resistance R311 of the substrate layer 311 is greater than the sheet resistance R41 of the doped well region 41, a resistance of the flow path FP14 may be greater than a resistance of the flow path FP13 so as to reduce the current $I_{49}$.

Figure 7:
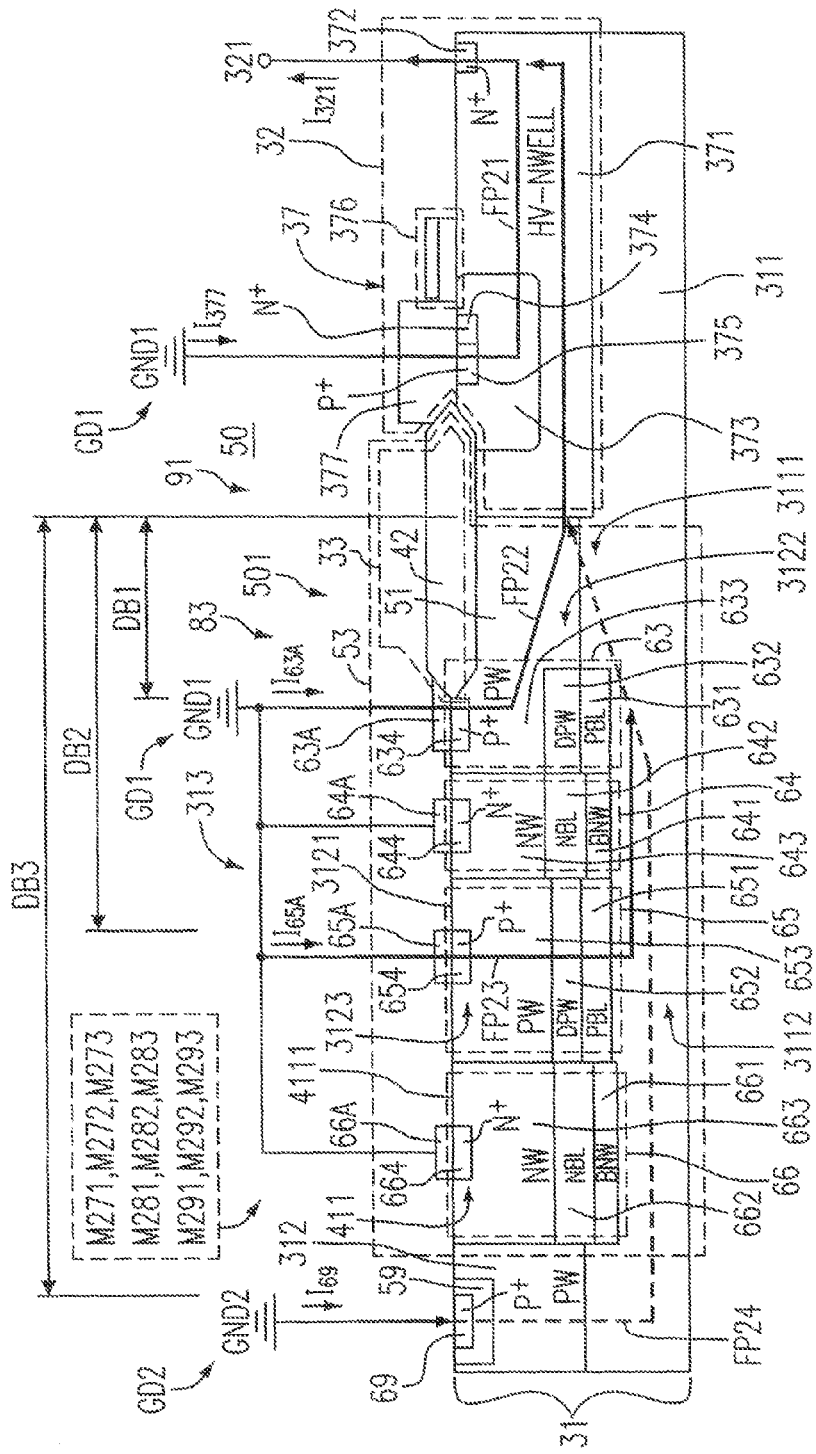
FIG. 7 is a schematic diagram showing a semiconductor structure in accordance with various embodiments of the present disclosure.

FIG. 7 is a schematic diagram showing a semiconductor structure 50 according to various embodiments of the present disclosure. The semiconductor structure 50 includes a semiconductor substrate 31, a device region 32, a guard structure 53 and a circuit region 59, wherein each of the device region 32, the guard structure 53 and the circuit region 59 is coupled to or disposed in the semiconductor substrate 31, and the guard structure 53 is disposed between the device region 32 and the circuit region 59. In some embodiments, the respective structures of the semiconductor substrate 31 and the device region 32 are shown in FIG. 6. In some embodiments, the guard structure 53 in FIG. 7 includes a doped well region 51, an isolation structure 33, guard rings 63, 64, 65 and 66, and contacts 63A, 64A, 65A and 66A, wherein the structure of the isolation structure 33 including dielectric region 42 is shown in FIG. 6.

In some embodiments, the doped well region 51 is a portion of the doped well region 41 in FIG. 6, is disposed over a portion of sub substrate layer 311, is coupled between the guard ring 63 and the device region 32, and includes the first conductivity type. The dielectric region 42 is coupled to the guard ring 63, and is disposed over the doped well region 51 and a portion of the device region 32. The semiconductor substrate 31 in FIG. 7 further includes a guard region 313 coupled to the device region 32 and the circuit region 59. For instance, the guard region 313 for forming the guard structure 53 is disposed between the device region 32 and the circuit region 59, and is configured to form the doped well region 51, the isolation structure 33, and the guard rings 63, 64, 65 and 66. For instance, the guard region 313 includes a portion of the substrate layer 311 and a portion of the epitaxial layer 312.

In some embodiments, the guard ring 63 in FIG. 7 has the first conductivity type, surrounds the dielectric region 42, is coupled to the dielectric region 42, and is electrically connected to the ground GND1. For instance, the ground GND1 is a high-voltage ground or a relatively-high-voltage ground, and the ground GND2 is a low-voltage ground or a relatively-low-voltage ground. The guard ring 64 has the second conductivity type, surrounds the guard ring 63, and is electrically connected to the ground GND1. The guard ring 65 has the first conductivity type, surrounds the guard ring 64, and is electrically connected to the ground GND1. The guard ring 66 has the second conductivity type, surrounds the guard ring 65, and is electrically connected to the ground GND1. The circuit region 59 is outside the guard structure 53, is disposed in the epitaxial layer 312, and includes a pick-up region 69. For instance, the circuit region 59 is a low-power circuit region, and is similar to one of the additional circuit regions 352 and 353 shown in FIG. 3. The pick-up region 69 is outside the guard ring 63, is electrically connected to the ground GND2, has the first conductivity type, extends downward from the top surface 3121, and is disposed in the top portion 323 at a predetermined distance DB3 from the device region 32.

In some embodiments, the guard ring 63 includes a buried layer sub-ring 631, a deep well sub-ring 632, a doped well sub-ring 633 and a pick-up sub-ring 634. The buried layer sub-ring 631 has the first conductivity type, and is at least mainly disposed in the top portion 3111 of the substrate layer 311. For instance, the buried layer sub-ring 631 is heavily doped. The deep well sub-ring 632 has the first conductivity type, and is disposed on the buried layer sub-ring. For instance, the deep well sub-ring 632 is at least mainly disposed in the bottom portion 3122 of the epitaxial layer 312. For instance, the deep well sub-ring 632 is doped lighter than the buried layer sub-ring 631 and heavier than the doped well region 41. The doped well sub-ring 633 has the first conductivity type, and is disposed between the deep well sub-ring 632 and the top surface 321 of the epitaxial layer 312. For instance, the doped well sub-ring 633 is a portion of the doped well region 41 in FIG. 6. The pick-up sub-ring 634 has the first conductivity type, and is disposed in the doped well sub-ring 633. For instance, the pick-up sub-ring 634 is heavily doped, and extends downward from the top surface 3121 into the doped well sub-ring 633.

In some embodiments, the guard ring 63 has a first dopant concentration distribution, and the first dopant concentration distribution is arranged to cause the guard ring 63 to include a first intermediate layer sub-ring, which has a first minimum dopant concentration for the guard ring 63. For instance, the first intermediate layer sub-ring is the doped well sub-ring 633 of the guard ring 63.

In some embodiments, the guard ring 65 includes a buried layer sub-ring 651, a deep well sub-ring 652, a doped well sub-ring 653 and a pick-up sub-ring 654. For instance, the respective structures of the buried layer sub-ring 651, the deep well sub-ring 652, the doped well sub-ring 653 and the pick-up sub-ring 654 are similar to the respective structures of the buried layer sub-ring 631, the deep well sub-ring 632, the doped well sub-ring 633 and the pick-up sub-ring 634, respectively.

In some embodiments, the guard ring 64 includes a buried well sub-ring 641, a buried layer sub-ring 642, a doped well sub-ring 643 and a pick-up sub-ring 644. The buried well sub-ring 641 has the second conductivity type, and is at least mainly disposed in the top portion 3111 of the substrate layer 311. The buried layer sub-ring 642 has the second conductivity type, and is disposed on the buried well sub-ring. For instance, the buried layer sub-ring 642 is at least mainly disposed in the bottom portion 3122 of the epitaxial layer 312. For instance, the buried layer sub-ring 642 is heavily doped. The doped well sub-ring 643 has the second conductivity type, and is disposed between the buried layer sub-ring 642 and the top surface 3121 of the epitaxial layer 312. For instance, the buried well sub-ring 641 is doped lighter than the buried layer sub-ring 642 and heavier than the doped well sub-ring 643. The pick-up sub-ring 644 has the second conductivity type, and is disposed in the doped well sub-ring 643. For instance, the pick-up sub-ring 644 is heavily doped, and extends downward from the top surface 4111 into the doped well sub-ring 643.

In some embodiments, the guard ring 64 has a second dopant concentration distribution, and the second dopant concentration distribution is arranged to cause the guard ring 64 to include a second intermediate layer sub-ring, which has a second minimum dopant concentration for the guard ring 64. For instance, the second intermediate layer sub-ring is the doped well sub-ring 643 of the guard ring 64.

In some embodiments, the guard ring 66 includes a buried well sub-ring 661, a buried layer sub-ring 662, a doped well sub-ring 663 and a pick-up sub-ring 664. For instance, the respective structures of the buried well sub-ring 661, the buried layer sub-ring 662, the doped well sub-ring 663 and the pick-up sub-ring 664 are similar to the respective structures of the buried well sub-ring 641, the buried layer sub-ring 642, the doped well sub-ring 643 and the pick-up sub-ring 644, respectively. In some embodiments, the guard structure 53 further includes the portion 3112 of the substrate layer 311. The semiconductor structure 50 further includes a specific region 501 coupled to the circuit region 59 and the high-voltage well region 371. The specific region 501 may include the pick-up region 375, a portion of the body region 373 and the guard structure 53, wherein the guard structure 53 includes the doped well region 41, the dielectric region 42, the guard rings 63, 64, 65 and 66, and the portion 3112 of the substrate layer 311.

In some embodiments, the contacts 63A, 64A, 65A and 66A are in contact with the pick-up sub-rings 634, 644, 654 and 664, respectively. The pick-up sub-rings 634, 644, 654 and 664 are grounded through the contacts 63A, 64A, 65A and 66A, respectively. The pick-up sub-rings 634 and 654 may be located at predetermined distances DB1 and DB2 from the device region 32, respectively. For instance, the predetermined distances DB1, DB2 and DB3 correspond to the distances DA1, DA2 and DA3 in FIG. 5A, respectively. For instance, the pick-up sub-ring 634, the pick-up sub-ring 654 and the pick-up region 69 correspond to the P$^+$-type pick-up regions 271, 272 and 273 in FIG. 5A, respectively, or correspond to the P$^+$-type pick-up regions 281, 282 and 283 in FIG. 5A, respectively, or correspond to the P$^+$-type pick-up regions 291, 292 and 293 in FIG. 5A, respectively.

In some embodiments, the semiconductor structure 50 is tested to estimate the guard performance thereof; the pick-up region 69 and the contact 377 are coupled to the grounds GND2 and GND1, respectively; and the specific terminal 321 of the device region 32 receives a current $I_{321}$. For instance, the semiconductor structure 50 further receives a supply voltage (such as the bias voltage $V_A$ in FIG. 3), which can be a relatively high supply voltage. For instance, the current $I_{321}$ is a flow-out current, and is like the current $I_{REV}$ in the reverse-current state in FIG. 2. The semiconductor structure 50 generates currents $I_{377}$, $I_{63A}$, $I_{65A}$ and $I_{69}$ from respectively the contact 377, the contact 63A, the contact 65A and the pick-up region 69 in response to the current $I_{321}$. For instance, the currents $I_{377}$, $I_{63A}$, $I_{65A}$ and $I_{69}$ are flow-in currents, respectively, and have flow paths FP21, FP22, FP23 and FP24, respectively.

In some embodiments, the currents $I_{321}$, $I_{377}$, $I_{63A}$, $I_{65A}$ and $I_{69}$ have a relationship of $(I_{377}+I_{63A}+I_{65A}+I_{69}=I_{321})$ (e.g., $I_{321}$=100 mA). The semiconductor structure 50 may serve as the switch 114 of the power converter 10 in FIG. 2, and have a latch-up free operation. In some embodiments, because the current relationship $((I_{377}+I_{63A}+I_{65A})\gg I_{69})$ is configured in the semiconductor structure 50, an attenuation L69 for a position of the pick-up region 69 is determined according to a formula of $20 \cdot \log(I_{69}/(I_{377}+I_{63A}+I_{65A}))$ or according to a formula of $20 \cdot \log(I_{69}/I_{321})$.

In some embodiments, the flow path FP21 runs from the ground GND1 to the specific terminal 321 through the contact 377, the pick-up region 375, the body region 373, the high-voltage well region 371 and the drain region 372. The flow path FP22 runs from the ground GND1 to the specific terminal 321 through the contact 63A, the guard ring 63, the doped well region 51, the high-voltage well region 371 and the drain region 372. The flow path FP23 runs from the ground GND1 to the specific terminal 321 through the contact 65A, the guard ring 65, the portion 3112 of the substrate layer 311, the doped well region 51, the high-voltage well region 371 and the drain region 372. The flow path FP24 runs from the ground GND2 to the specific terminal 321 through the pick-up region 69, the doped well region 51, the portion 3112 of the substrate layer 311, the high-voltage well region 371 and the drain region 372.

In some embodiments, the semiconductor structure 50 may further be configured to have positions M271, M272, M273, M281, M282, M283, M291, M292 and M293, which correspond to the positions K271, K272, K273, K281, K282, K283, K291, K292 and K293 in FIG. 5A, respectively. For instance, each of the positions M271, M281 and M291 is located at the predetermined distance DB1 from the device region 32; each of the positions M272, M282 and M292 is located at the predetermined distance DB2 from the device region 32; and each of the positions M273, M283 and M293 is located at the predetermined distance DB3 from the device region 32. For instance, the device region 32 has a device size 22A, which has a length LT1 and a width WT1.

In some embodiments, the guard structure 53 causes the noise signal to pass through the high resistance area of the semiconductor substrate 31 except the surface of the semiconductor substrate 31. For instance, the high resistance area is the intrinsic substrate area without any doping. When the resistance of the noise-signal path increases, the isolation distance can be decreased. Hence, smaller chip area can be achieved.

In some embodiments, when the semiconductor structure 50 serves as the switch 114 in FIG. 2, the guard structure 53 of semiconductor structure 50 can avoid the current $I_{REV}$ in the reverse-current state and the switching noise being coupled from the driver to the noise sensitivity circuit (such as the low-voltage circuit 124 in FIG. 2) in the power converter 10 in FIG. 2. For instance, the power converter 10 is a DC-to-DC converter or an AC-to-DC converter, wherein the DC-to-DC converter may be a buck converter or a half-bridge converter. Employing the guard structure 53 of semiconductor structure 50, a shorter-distance but high-isolation structure between the driver and the low-voltage circuit can be disposed in the power converter.

In some embodiments, FIG. 7 further shows a semiconductor layout pattern 91, which represents the semiconductor structure 50. For instance, the semiconductor layout pattern 91 includes the semiconductor substrate 31, the device region 32, a guard layout pattern 83 representing the guard structure 53, and the circuit region 59. The guard layout pattern 83 surrounds the device region 32, and includes the doped well region 51, the isolation structure 33, the guard rings 63, 64, 65 and 66, and the contacts 63A, 64A, 65A and 66A.

In some embodiments, the semiconductor layout pattern 91 is analyzed to estimate the guard performance thereof; the pick-up region 69 and the contact 377 are coupled to ground layout patterns GD2 and GD1 respectively, which represent the grounds GND2 and GND1 respectively; and the specific terminal 321 of the device region 32 analytically receives a current $I_{321}$. For instance, the semiconductor structure 50 further analytically receives a supply voltage (such as representing the bias voltage $V_A$ in FIG. 3), which can be a relatively high supply voltage; the ground layout pattern GD1 is a high-voltage ground layout pattern or a relatively-high-voltage ground layout pattern; and the ground layout pattern GD2 is a low-voltage ground layout pattern or a relatively-low-voltage ground layout pattern. For instance, the current $I_{321}$ is a flow-out current, and is like the current $I_{REV}$ in the reverse-current state in FIG. 2. The semiconductor layout pattern 91 analytically generates currents $I_{377}$, $I_{63A}$, $I_{65A}$ and $I_{69}$ from respectively the contact 377, the contact 63A, the contact 65A and the pick-up region 69 in response to the current $I_{321}$. For instance, the currents $I_{377}$, $I_{63A}$, $I_{65A}$ and $I_{69}$ are flow-in currents, respectively, and have flow paths FP21, FP22, FP23 and FP24, respectively.

In some embodiments, the currents $I_{321}$, $I_{377}$, $I_{63A}$, $I_{65A}$ and $I_{69}$ have a relationship of $(I_{377}+I_{63A}+I_{65A}+I_{69}=I_{321})$ (e.g., $I_{321}$=100 MA). In some embodiments, because the current relationship $((I_{377}+I_{63A}+I_{65A})\gg I_{69})$ is configured in the semiconductor layout pattern 91, an attenuation L69 for a position of the pick-up region 69 is determined according to a formula of $20 \cdot \log(I_{69}/(I_{377}+I_{63A}+I_{65A}))$ or according to a formula of $20 \cdot \log(I_{69}/I_{321})$.

Figure 8:
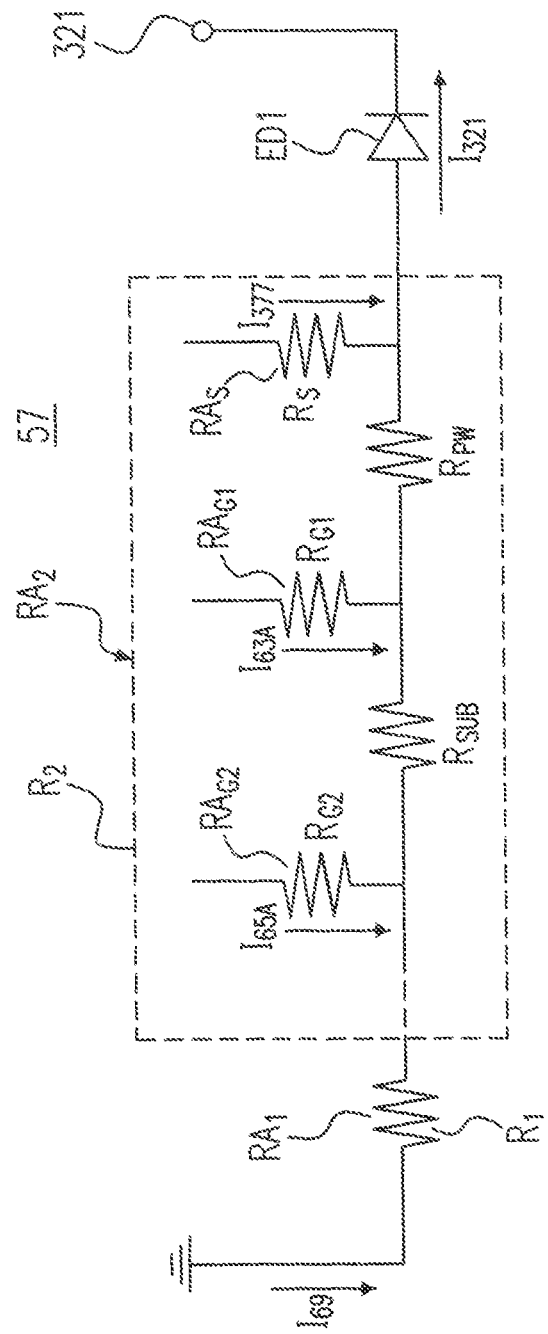
FIG. 8 is a schematic diagram showing an equivalent model of the semiconductor structure in FIG. 7.

FIG. 8 is a schematic diagram showing an equivalent model 57 of the semiconductor structure 50 in FIG. 7. The equivalent model 57 includes an equivalent resistor $R_1$, an equivalent resistor $R_2$ and a diode ED1. For instance, the specific region 501 includes the equivalent resistor $R_2$, which includes resistors $R_S$, $R_{G1}$, $R_{G2}$, $R_{PW}$ and $R_{SUB}$. The resistor $R_S$, the resistor $R_{G1}$, the resistor $R_{G2}$ and the equivalent resistor $R_1$ may transmit the currents $I_{377}$, $I_{63A}$, $I_{65A}$ and $I_{69}$, respectively. The diode ED1 may transmit the current $I_{321}$.

In some embodiments, the current $I_{321}$ corresponds to the current $I_{REV}$ in FIG. 2. The resistors $R_{PW}$, $R_{SUB}$, $R_S$, $R_{G1}$ and $R_{G2}$ in FIG. 8 are associated with the doped well region 41, the substrate layer 311, the body region 373, the guard ring 63 and the guard ring 65, respectively; the equivalent resistor $R_1$ is associated with the doped well region 41 and the substrate layer 311; and the diode ED1 is associated with the body region 373 and the high-voltage well region 371. The equivalent resistors $R_1$ and $R_2$, and the resistors $R_S$, $R_{G1}$ and $R_{G2}$ have resistances $RA_1$, $RA_2$, $RA_S$, $RA_{G1}$ and $RA_{G2}$, respectively.

In some embodiments, the semiconductor structure 50 is configured to cause the resistance $RA_1$ to be much larger than the resistance $RA_2$, cause the resistance $RA_{G1}$ to approximate the resistance $RA_S$, and cause the resistance $RA_{G2}$ to approximate the resistance $RA_S$. For instance, it is determined whether the semiconductor structure 60 needs an additional guard ring, so that the semiconductor structure 50 can have an optimum ratio of the current $I_{321}$ to the current $I_{69}$ to optimize the attenuation L69 for the position of the pick-up region 69. For instance, the more guard rings the semiconductor structure 50 includes, the larger ratio of the current $I_{321}$ to the current $I_{69}$ the semiconductor structure 50 has.

Figure 9:
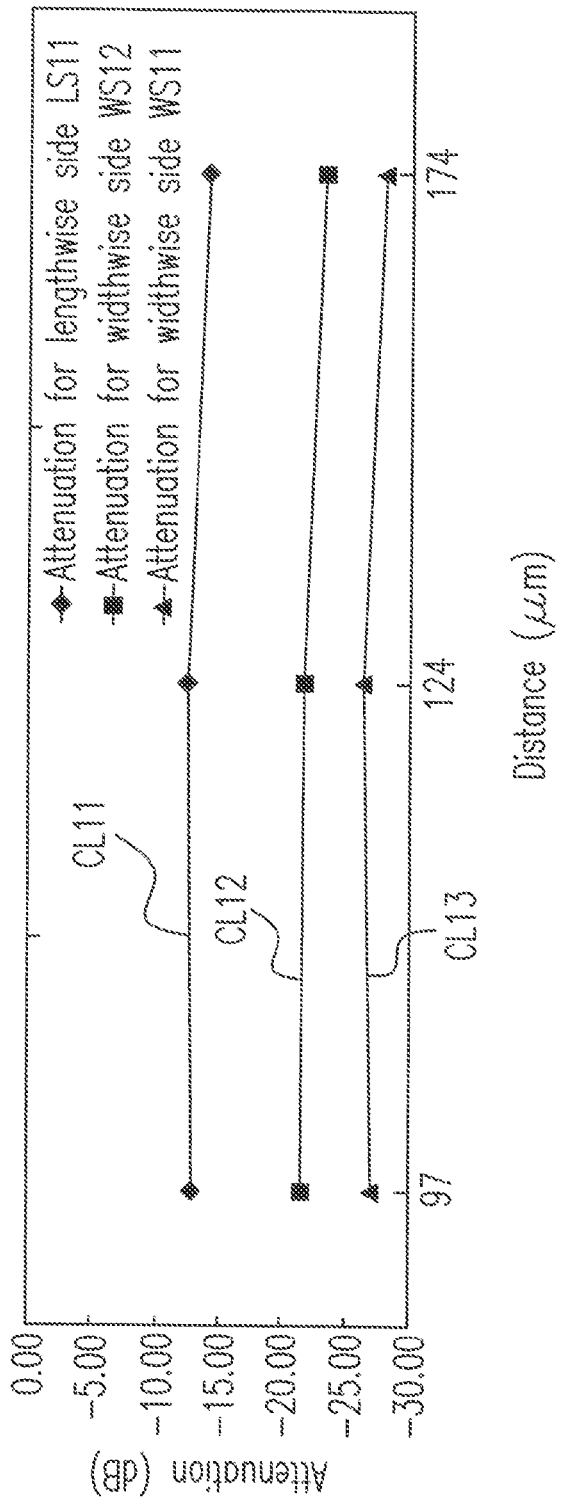
FIG. 9 is a schematic diagram showing a first attenuation graph of the semiconductor structure in FIG. 6.

FIG. 9 is a schematic diagram showing a first attenuation graph of the semiconductor structure 50 in FIG. 6. Please further refer to FIGS. 2 and 5A. The first attenuation graph shows attenuation values in the y axis, distance values in the x axis, and attenuation curves CL11, CL12 and CL13, wherein the distances are measured from the device region 32. The attenuation curves CL11, CL12 and CL13 may be obtained from the following conditions: the device region 32 is a high-voltage device region; the length LT1 and the width WT1 have a length value of 1000 μm and a width value of 500 μm, respectively; and the current $I_{321}$ has a current value of 100 mA and may be like the current $I_{REV}$ in the reverse-current state in FIG. 2.

In some embodiments, each of the attenuation curves CL11, CL12 and CL13 shows a first distance, a second distance and a third distance. The first, the second and the third distances have distance values 97 μm, 124 μm and 174 μm, respectively, and may be the predetermined distances DB1, DB2 and DB3, respectively. The attenuation curve CL11 shows attenuations at the respective positions M291, M292 and M293 for the lengthwise side LS11. The attenuation curve CL12 shows attenuations at the respective positions M281, M282 and M283 for the widthwise side WS12. The attenuation curve CL13 shows attenuations at the respective positions M271, M272 and M273 for the widthwise side WS11.

Figure 10:
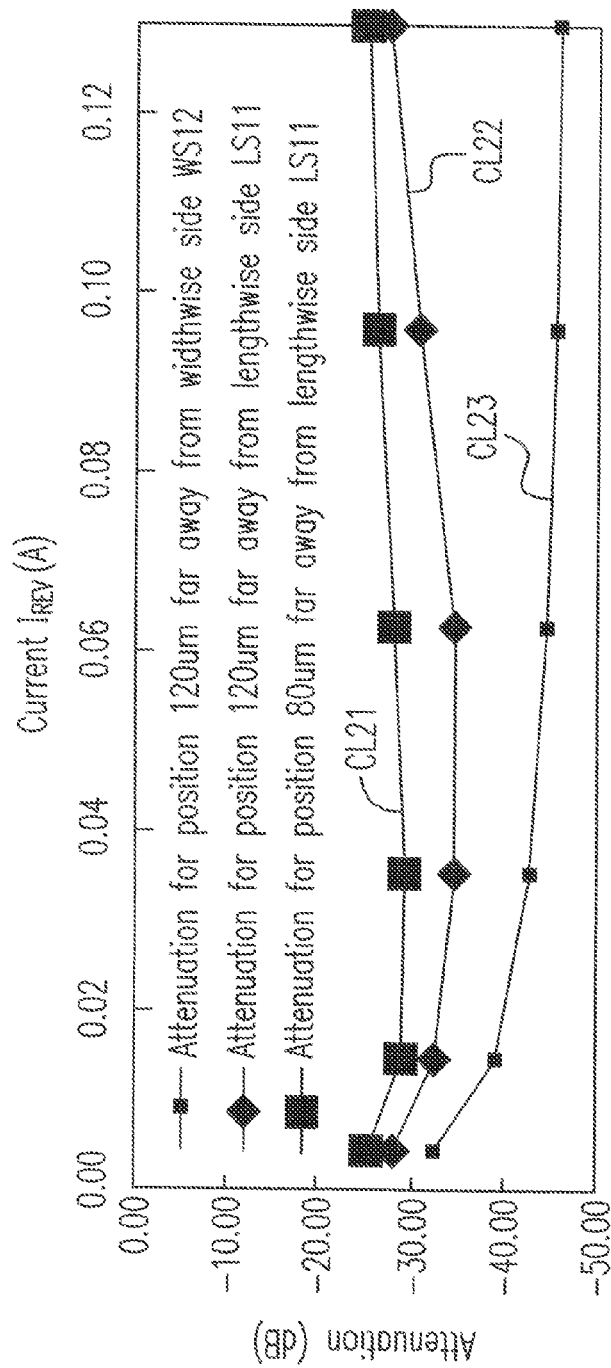
FIG. 10 is a schematic diagram showing a second attenuation graph of the semiconductor structure in FIG. 7.

FIG. 10 is a schematic diagram showing a second attenuation graph of the semiconductor structure 50 in FIG. 7. Please further refer to FIGS. 2 and 5A. The first attenuation graph shows attenuation values in the y axis, current valves of the current $I_{REV}$ in the reverse-current state in the x axis, and attenuation curves CL21, CL22 and CL23. The attenuation curves CL21, CL22 and CL23 may be obtained from the following conditions: the device region 32 is a high-voltage device region; and the length LT1 and the width WT1 have a length value of 1000 μm and a width value of 450 μm, respectively.

In some embodiments, the attenuation curves CL21, CL22 and CL23 are obtained for a first position, a second position and a third position, respectively. The first position is located in the widthwise region WR12, and is far away from the widthwise side WS12 by a distance value of 120 μm. The second position is located in the lengthwise region LR11, and is far away from the lengthwise side LS11 by a distance value of 120 μm. The third position is located in the lengthwise region LR11, and is far away from the lengthwise side LS11 by a distance value of 80 μm.

Figure 11:
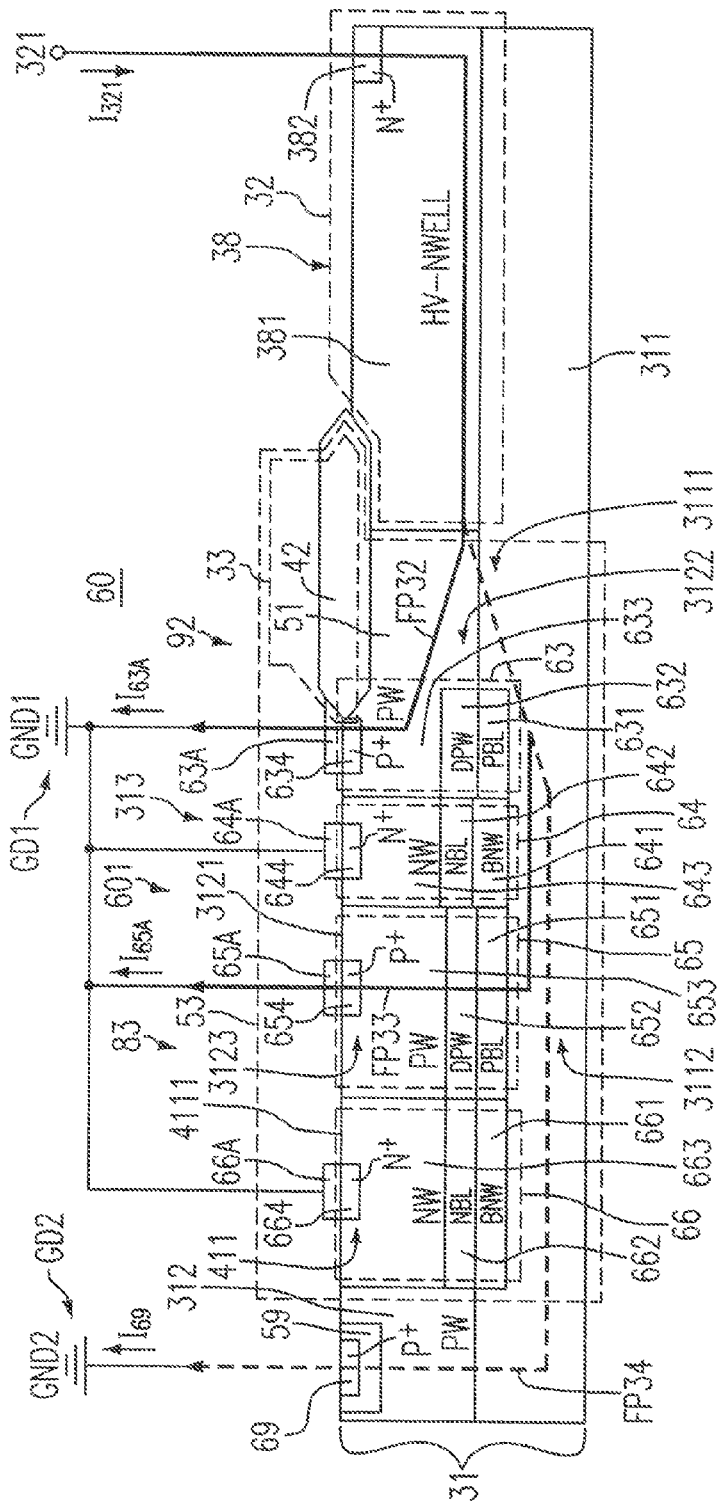
FIG. 11 is a schematic diagram showing a semiconductor structure in accordance with various embodiments of the present disclosure.

FIG. 11 is a schematic diagram showing a semiconductor structure 60 according to various embodiments of the present disclosure. The semiconductor structure 60 includes a semiconductor substrate 31, a device region 32, a guard structure 53 and a circuit region 59. In some embodiments, the respective structures of the semiconductor substrate 31, the guard structure 53 and the circuit region 59 are shown in FIG. 7. For instance, the device region 32 is a specific region 38, and includes a specific terminal 321.

In some embodiments, the specific region 38 includes a high-voltage well region 381 and a pick-up region 382. The high-voltage well region 381 has the second conductivity type, and is disposed in the semiconductor substrate 31. For instance, the high-voltage well region 381 extends downward from the top surface 3121 to the bottom portion 3122. The pick-up region 382 has the second conductivity type, is disposed in the high-voltage well region 381, and is electrically connected to the specific terminal 321. For instance, the pick-up region 382 is heavily doped (such as doped heavier than the high-voltage well region 381), and serves as a strap well region. For instance, the semiconductor structure 60 further includes a specific region 601. The specific region 601 may include the guard structure 53, which includes the guard rings 63, 64, 65 and 66, and the portion 3112 of the substrate layer 311.

In some embodiments, the semiconductor structure 60 is tested to estimate the guard performance thereof; the pick-up region 69 is coupled to the ground GND2; and the specific terminal 321 of the device region 32 receives a current $I_{321}$. For instance, the current $I_{321}$ is a flow-in current, and is like the current $I_{CHARGE}$ in the charge-current state in FIG. 4. The semiconductor structure 60 generates currents $I_{63A}$, $I_{65A}$ and $I_{69}$ from respectively the contact 63A, the contact 65A and the pick-up region 69 in response to the current $I_{321}$. For instance, the currents $I_{63A}$, $I_{65A}$ and $I_{69}$ are flow-out currents, respectively, and have flow paths FP32, FP33 and FP34, respectively.

In some embodiments, the currents $I_{321}$, $I_{63A}$, $I_{65A}$ and $I_{69}$ have a relationship of $(I_{63A}+I_{65A}+I_{69}=I_{321})$ (e.g., $I_{321}=100$ mA). In some embodiments, the semiconductor structure 60 serves as the driver 122 of the power converter 10 in FIG. 4. In some embodiments, an attenuation L69 for a position of the pick-up region 69 is determined according to a formula of $20 \cdot \log(I_{69}/I_{321})$. In order to prevent the substrate noise (e.g., resulting from a current like the current $I_{CHARGE}$ in FIG. 4) of the semiconductor structure 60 in FIG. 11, the semiconductor structure 60 is configured to cause the current $I_{69}$ to be as small as possible.

In some embodiments, the flow path FP32 runs from the specific terminal 321 to the ground GND1 through the pick-up region 382, the high-voltage well region 381, the doped well region 41, the guard ring 63 and the contact 63A. The flow path FP33 runs from the specific terminal 321 to the ground GND1 through the pick-up region 382, the high-voltage well region 381, the doped well region 41, the portion 3112 of the substrate layer 311, the guard ring 65 and the contact 65A. The flow path FP34 runs from the specific terminal 321 to the ground GND2 through the pick-up region 382, the high-voltage well region 381, the doped well region 41, the portion 3112 of the substrate layer 311 and the pick-up region 69.

In some embodiments, FIG. 11 further shows a semiconductor layout pattern 92, which represents the semiconductor structure 60 and includes the semiconductor substrate 31, the device region 32, a guard layout pattern 83 representing the guard structure 53, and the circuit region 69. The guard layout pattern 83 surrounds the device region 32, and includes the doped well region 51, the isolation structure 33, the guard rings 63, 64, 65 and 66, and the contacts 63A, 64A, 65A and 66A.

Figure 12:
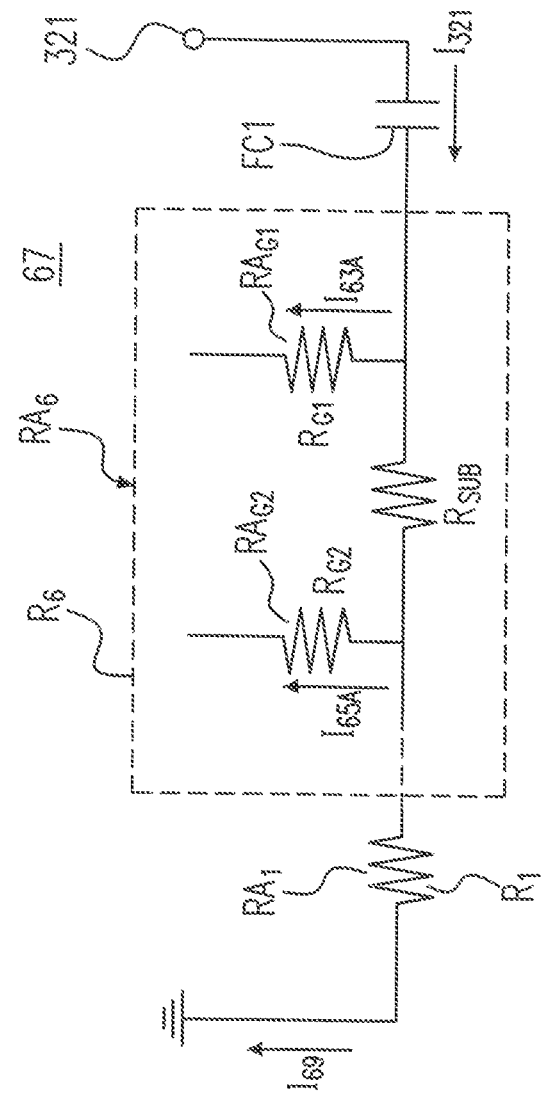
FIG. 12 is a schematic diagram showing an equivalent model of the semiconductor structure in FIG. 11.

FIG. 12 is a schematic diagram showing an equivalent model 67 of the semiconductor structure 60 in FIG. 11. The equivalent model 67 includes an equivalent resistor $R_1$, an equivalent resistor $R_6$ and a capacitor FC1. For instance, the guard region 601 includes the equivalent resistor $R_6$, which includes resistors $R_{G1}$, $R_{G2}$ and $R_{SUB}$. The resistor $R_{G1}$, the resistor $R_{G2}$ and the equivalent resistor $R_1$ may transmit the currents $I_{63A}$, $I_{65A}$ and $I_{69}$, respectively. The capacitor FC1 may transmit the current $I_{321}$, which may be a charge current.

In some embodiments, the current $I_{321}$ may correspond to the current $I_{CHARGE}$ in FIG. 4. The resistors $R_{SUB}$, $R_{G1}$ and $R_{G2}$ in FIG. 11 may be associated with the substrate layer 311, the guard ring 63 and the guard ring 65, respectively; the equivalent resistor $R_1$ may be associated with the doped well region 41 and the substrate layer 311; and the capacitor FC1 is a capacitor of the PN junction of the high-voltage well region 381 (such as a high-voltage N-type well region) and the substrate layer 311 (such as a P⁻-type semiconductor substrate). The equivalent resistors $R_1$ and $R_6$, and the resistors $R_{G1}$ and $R_{G2}$ have resistances $RA_1$, $RA_6$, $RA_{G1}$ and $RA_{G2}$, respectively.

In some embodiments, the semiconductor structure 60 is configured to cause the resistance $RA_1$ to be much larger than the resistance $RA_6$, and to cause the resistance $RA_{G1}$ to approximate the resistance $RA_{G2}$. For instance, it is determined whether the semiconductor structure 60 needs an additional guard ring, so that the semiconductor structure 60 can have an optimum ratio of the current $I_{321}$ to the current $I_{69}$ to optimize the attenuation L69 for the position of the pick-up region 69. For instance, the more guard ring the semiconductor structure 60 includes, the larger ratio of the current $I_{321}$ to the current $I_{69}$ the semiconductor structure 60 has.

Figure 13:
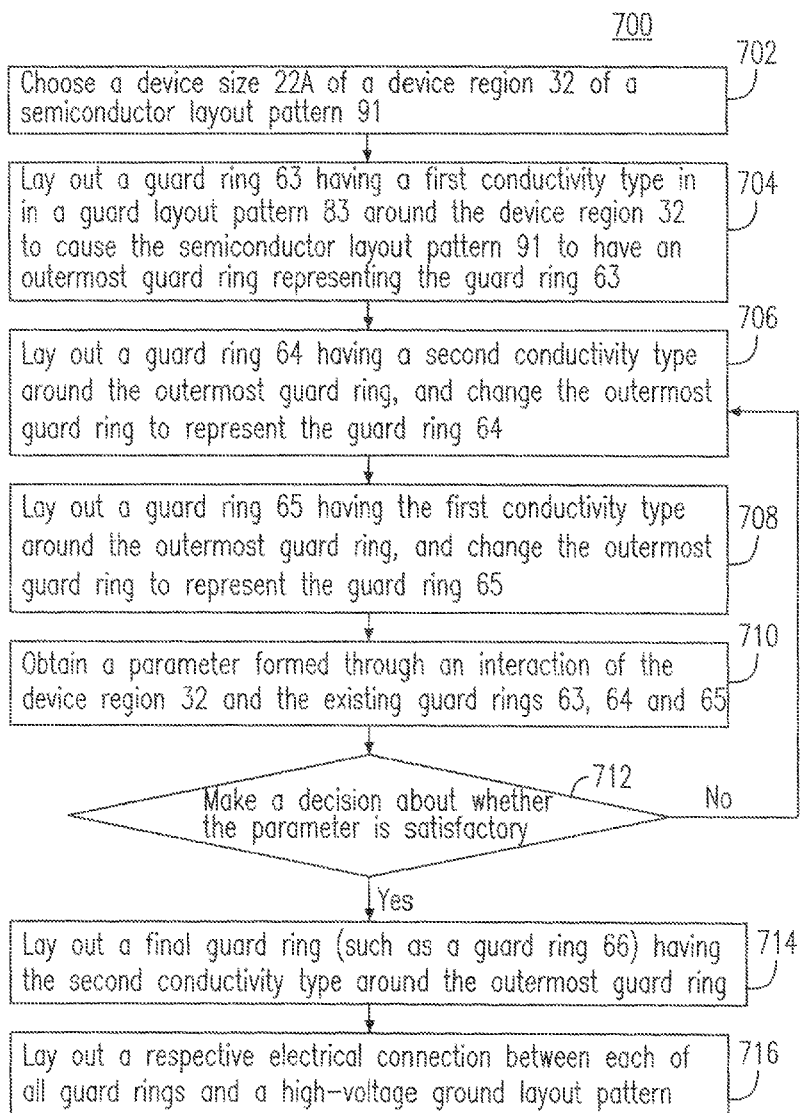
FIG. 13 is a flowchart showing a method of laying out a guard layout pattern for a semiconductor layout pattern in FIG. 7.

FIG. 13 is a flowchart showing a method 700 of laying out a guard layout pattern 83 for a semiconductor layout pattern 91 in FIG. 7. In some embodiments, the method 700 serving as a design flow is applied to the semiconductor layout pattern 92 in FIG. 11. The semiconductor layout pattern 91 includes a device region 32 and the guard layout pattern 83 coupled to the device region 32. In step 702, a device size 22A of the device region 32 of the semiconductor structure 50 is chosen. For instance, the device region 32 is a high-voltage device region, which may be one of an ultra-high-voltage device region and a high-side high-voltage well device region.

In step 704, a guard ring 63 having a first conductivity type is laid out in the guard layout pattern 83 around the device region 32 to cause the semiconductor structure 50 to have an outermost guard ring representing the guard ring 63.

In step 706, a guard ring 64 having a second conductivity type is laid out in the guard layout pattern 83 around the outermost guard ring, and the outermost guard ring is changed to represent the guard ring 64. For instance, the first conductivity type is a P type and the second conductivity type is an N type.

In step 708, a guard ring 65 having the first conductivity type is laid out in the guard layout pattern 83 around the outermost guard ring, and the outermost guard ring is changed to represent the guard ring 65.

In step 710, a parameter formed through an interaction of the device region 32 and the existing guard rings 63, 64 and 65 is obtained, wherein the device region 32 includes a specific terminal 321, and the semiconductor layout pattern 91 further includes a pick-up region 69, which is disposed outside the outermost guard ring.

In step 710, an area covering the device region 32 and the existing guard rings 63, 64 and 65 is determined according to the device size 22A, a first signal is analytically provided to the specific terminal 321, a second signal is analytically generated from the pick-up region 69 in response to the first signal, and an attenuation is determined according to the first and the second signals, wherein the parameter includes the attenuation and the area.

In step 712, a decision about whether the parameter is satisfactory is made. The flow of the method 800 proceeds to step 814 when the decision is positive. The flow of the method 800 goes back to step 806 when the decision is negative.

In step 714, a final guard ring (such as a guard ring 66) having the second conductivity type is laid out in the guard layout pattern 83 around the outermost guard ring (or all guard rings).

In step 716, a respective electrical connection is laid out between each of all guard rings and a high-voltage ground layout pattern (such as the ground layout pattern GD1 representing the ground GND1).

Figure 14:
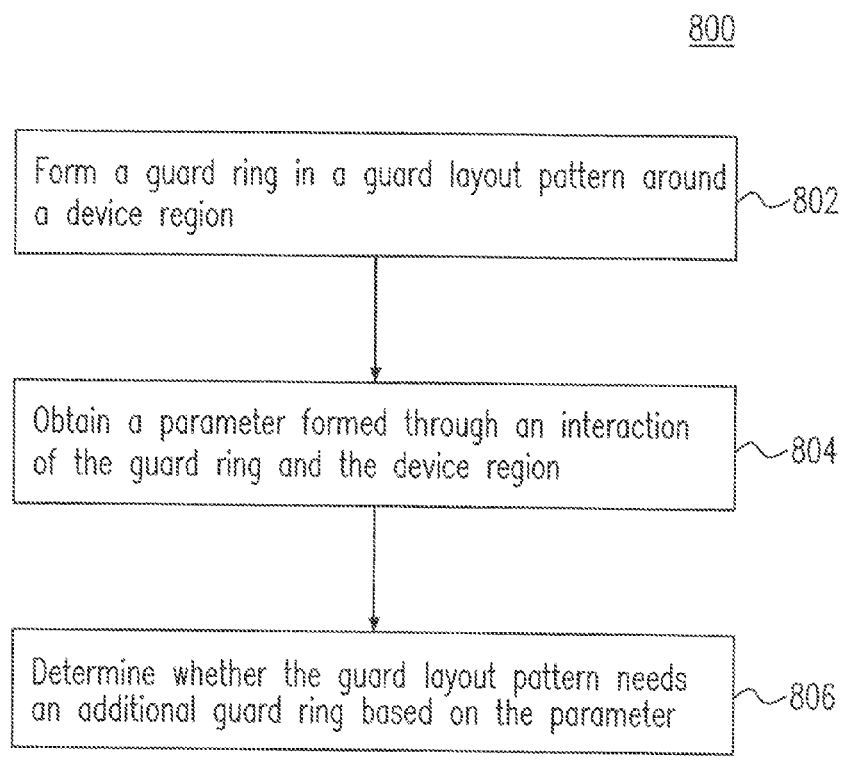
FIG. 14 is a flowchart showing a method of forming a guard layout pattern for a semiconductor layout pattern including a device region in FIG. 7.

FIG. 14 is a flowchart showing a method 800 of forming a guard layout pattern 83 for a semiconductor layout pattern 91 including a device region 32 in FIG. 7. In some embodiments, the semiconductor layout pattern 91 is used to form the semiconductor structure 50 in FIG. 7, and the guard layout pattern 83 is used to form the guard structure 53 in FIG. 7. In step 802, a guard ring 63 is formed in the guard layout pattern 83 around the device region 32. In step 804, a first parameter formed through an interaction of the guard ring 63 and the device region 32 is obtained. In step 806, whether the guard layout pattern 83 needs an additional guard ring is determined based on the first parameter. In some embodiments, the method 800 is applied to the semiconductor layout pattern 92 for forming the guard layout pattern 83 in FIG. 11.

In some embodiments, the semiconductor layout pattern 91 further includes a substrate layer 311 and an epitaxial layer 312, wherein the epitaxial layer 312 has a top surface 3121 and is disposed over the substrate layer 311. The device region 32 is disposed in the epitaxial layer 312. Step 802 of forming the guard ring 63 includes a sub-step of extending the guard ring 63 from the top surface 3121 into the substrate layer 311.

In some embodiments, the semiconductor layout pattern 91 further includes a guard region 313 coupled to the device region 32. For instance, the guard region 313 includes a portion of the substrate layer 311 and a portion of the epitaxial layer 312. Step 802 of forming the guard ring 63 includes a sub-step of arranging a dopant concentration distribution in the guard ring 63 to form a first intermediate layer sub-ring (such as the doped well sub-ring 633) having a first minimum dopant concentration for the guard ring 63.

In some embodiments, the device region 32 includes a specific terminal 321, the semiconductor layout pattern 91 further includes a pick-up region 69 outside the guard ring 63, and step 804 of obtaining the first parameter includes the following sub-steps. A device size 22A of the device region 32 is chosen. A first area covering the device region 32 and the guard ring 63 is determined according to the device size 22A. A first signal (such as a signal corresponding to the current $I_{321}$) is analytically provided to the specific terminal 321. A second signal (such as a signal corresponding to the current $I_{69}$) is analytically generated from the pick-up region 69 in response to the first signal. A first attenuation (such as an attenuation like the attenuation $L_{69}$) is determined according to the first and the second signals, wherein the first parameter includes the first attenuation and the first area. A first electrical connection is formed between the guard ring 63 and a high-voltage ground layout pattern (such as the ground layout pattern GD1 representing the ground GND1). A first coupling is formed between the pick-up region 69 and a low-voltage ground layout pattern (such as the ground layout pattern GD2 representing the ground GND2).

In some embodiments, the guard ring 63 has a first conductivity type, and the method 800 further includes the following steps. A first decision about whether the guard layout pattern 83 needs a first guard ring (such as a guard ring 64) is made when the first parameter is satisfactory. The first guard ring (such as the guard ring 64) having a second conductivity type is formed around the guard ring 63 and each of the guard ring 63 and a second electrical connection is formed between the first guard ring (such as the guard ring 64) and a high-voltage ground layout pattern (such as the ground layout pattern GD1 representing the ground GND1), when the first decision is positive. A guard ring 64 having the second conductivity type around the guard ring 63 and a guard ring 65 having the first conductivity type are formed around the guard ring 64 when the first parameter is unsatisfactory.

In some embodiments, the first conductivity type is a P type and the second conductivity type is an N type. In some embodiments, the first conductivity type is an N type and the second conductivity type is a P type. The pick-up region 69 is located outside the guard ring 65. In some embodiments, the step of forming the guard ring 64 includes a sub-step of arranging a second dopant concentration distribution in the guard ring 64 to form a second intermediate layer sub-ring (such as the doped well sub-ring 643) having a second minimum dopant concentration for the guard ring 64.

In some embodiments, the method 800 further includes the following steps. A second parameter formed through an interaction of the guard rings 63, 64 and 65 and the device region 32 is obtained. A second decision about whether the guard layout pattern 83 needs a second guard ring (such as a guard ring 66) is made when the second parameter is satisfactory. The second guard ring (such as the guard ring 66) having the second conductivity type is formed around the guard ring 65 and a respective electrical connection is formed between the high-voltage ground layout pattern (such as the ground layout pattern GD1 representing the ground GND1) and each of the guard rings 63, 64 and 65 and the second guard ring (such as the guard ring 66), when the second decision is positive. A guard ring 66 around the guard ring 65 and a third guard ring around the guard ring 66 are formed when the second parameter is unsatisfactory, wherein the guard ring 66 has the second conductivity type, and the third guard ring has the first conductivity type.

In some embodiments, the step of obtaining the second parameter includes the following sub-steps. A second area covering the device region 32 and the guard rings 63, 64 and 65 is determined according to the device size 22A. A third signal (such as a signal corresponding to the current $I_{321}$) is analytically provided to the specific terminal 321. A fourth signal (such as a signal corresponding to the current $I_{69}$) is analytically generated from the pick-up region 69 in response to the third signal. A second attenuation (such as an attenuation like the attenuation $L_{69}$) is determined according to the third and the fourth signals, wherein the second parameter includes the second attenuation and the second area. A second coupling is formed between the pick-up region 69 and the low-voltage ground layout pattern (such as the ground layout pattern GD1 representing the ground GND2).

In some embodiments, the device region 32 is a specific region 37, which is laid out to include a high-voltage well region 371, a drain region 372, a body region 373, a source region 374, a pick-up region 375, a gate structure 376 and a contact 377. The high-voltage well region 371 has the second conductivity type, and is disposed in the semiconductor substrate 31. The drain region 372 has the second conductivity type, is disposed in the high-voltage well region 371, and is electrically connected to the specific terminal 321. The body region 373 has the first conductivity type, and is disposed in the high-voltage well region 371. The source region 374 has the second conductivity type, and is disposed in the body region 373. The pick-up region 375 has the first conductivity type, is disposed in the body region 373, and is coupled to the source region 374. The gate structure 376 is disposed over a portion of the body region 373 and a portion of the high-voltage well region 371. The contact 377 is electrically connected to the source region 374 and the pick-up region 375.

In some embodiments with reference to FIG. 11, the device region 32 is a specific region 38, which is laid out to include a high-voltage well region 381 and a pick-up region 382. The high-voltage well region 381 has the second conductivity type, and is disposed in the semiconductor substrate 31. The pick-up region 382 has the second conductivity type, is disposed in the high-voltage well region 381, and is electrically connected to the specific terminal 321.

In some embodiments with reference to FIG. 7, a guard structure 53 for a semiconductor structure 50 includes guard rings 63, 64 and 65. The guard ring 63 has a first conductivity type. The guard ring 64 has a second conductivity type, and surrounds the guard ring 63. The guard ring 65 has the first conductivity type, and surrounds the second guard ring 64, wherein the guard rings 63, 64 and 65 are grounded.

In some embodiments with reference to FIG. 7, a guard structure 53 for a semiconductor structure 50 includes guard rings 63, 64 and 65. The guard ring 63 has a first conductivity type. The guard ring 64 has a second conductivity type, and surrounds the guard ring 63. The guard ring 65 has the first conductivity type, and surrounds the second guard ring 64, wherein the guard ring 65 is grounded.

A skilled person in the art will appreciate that there can be many variations to the embodiments of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A guard structure for a semiconductor structure, comprising:
   a first guard ring having a first conductivity type;
   a second guard ring having a second conductivity type, and surrounding the first guard ring;
   a third guard ring having the first conductivity type, and surrounding the second guard ring, wherein the first, the second and the third guard rings are grounded;
   wherein the first guard ring, the second guard ring, and the third guard ring comprising at least an upper portion, a middle portion and a lower portion, the lower portion further comprising a first portion and a second portion;
   at least one of the first guard ring, the second guard ring, and the third guard ring having a lower dopant concentration in the middle portion relative to the upper portion and the lower portion; and
   at least one of the first guard ring, the second guard ring, and the third guard ring having a higher dopant concentration in the first portion relative to the second portion and the middle portion, and wherein the first portion is between the second portion and the middle portion.

2. The guard structure according to claim 1, wherein the semiconductor structure comprises:
   a semiconductor substrate including the first conductivity type, a substrate layer and an epitaxial layer disposed over the substrate layer, wherein the substrate layer includes a top portion, and the epitaxial layer includes a top surface; and
   a device region disposed in the semiconductor substrate, and surrounded by the first guard ring.

3. The guard structure according to claim 2, further comprising:
   a doped well region disposed in the semiconductor substrate, coupled between the first guard ring and the device region, and including the first conductivity type;
   a dielectric region coupled to the first guard ring, and disposed over the doped well region and a portion of the device region, wherein the first conductivity type is a P type and the second conductivity type is an N type; and
   a fourth guard ring having the second conductivity type, and surrounding the third guard ring, wherein the first, the second, the third and the fourth guard rings are commonly electrically connected to a high-voltage ground.

4. The guard structure according to claim 3, wherein each of the first and the third guard rings comprises:
   a buried layer sub-ring having the first conductivity type, and at least mainly disposed in the top portion;
   a deep well sub-ring having the first conductivity type, and disposed on the buried layer sub-ring;
   a doped well sub-ring having the first conductivity type, and disposed between the top surface and the deep well sub-ring; and
   a pick-up sub-ring having the first conductivity type, and disposed in the doped well sub-ring.

5. The guard structure according to claim 4, wherein
   the buried layer sub-ring is heavily doped;
   the deep well sub-ring is doped lighter than the buried layer sub-ring and heavier than the doped well sub-ring; and
   the pick-up sub-ring is heavily doped.

6. The guard structure according to claim 3, wherein each of the second and the fourth guard rings includes:
   a buried layer sub-ring having the second conductivity type, and at least mainly disposed in the top portion;
   a buried layer sub-ring having the second conductivity type, and disposed on the buried well sub-ring;
   a doped well sub-ring having the second conductivity type, and disposed between the top surface and the buried layer sub-ring; and
   a pick-up sub-ring having the second conductivity type, and disposed in the doped well sub-ring.

7. The guard structure according to claim 6, wherein
   the buried layer sub-ring is heavily doped;
   the buried well sub-ring is doped lighter than the buried layer sub-ring and heavier than the doped well sub-ring; and
   the pick-up sub-ring is heavily doped.

8. A guard structure for a semiconductor structure, comprising:
   a first guard ring having a first conductivity type;
   a second guard ring having a second conductivity type, and surrounding the first guard ring;
   a third guard ring having the first conductivity type, and surrounding the second guard ring, wherein the third guard ring is grounded;
   wherein the first guard ring, the second guard ring, and the third guard ring comprising at least an upper portion, a middle portion and a lower portion, the lower portion further comprising a first portion and a second portion;
   at least one of the first guard ring, the second guard ring, and the third guard ring having a lower dopant concentration in the middle portion relative to the upper portion and the lower portion; and
   at least one of the first guard ring, the second guard ring, and the third guard ring having a higher dopant concentration in the first portion relative to the second portion and the middle portion, and wherein the first portion is between the second portion and the middle portion.

9. The guard structure according to claim 8, wherein the semiconductor structure comprises:
   a semiconductor substrate including the first conductivity type, a substrate layer and an epitaxial layer disposed over the substrate layer, wherein the substrate layer includes a top portion, and the epitaxial layer includes a top surface: and
   a device region disposed in the semiconductor substrate, and surrounded by the first guard ring.

10. The guard structure according to claim 9, further comprising:
    a doped well region disposed in the semiconductor substrate, coupled between the first guard ring and the device region, and including the first conductivity type;
    a dielectric region coupled to the first guard ring, and disposed over the doped well region and a portion of the device region, wherein the first conductivity type is a P type and the second conductivity type is an N type; and
    a fourth guard ring having the second conductivity type, and surrounding the third guard ring, wherein the first, the second, the third and the fourth guard rings are commonly electrically connected to a high-voltage ground, and extending downward from the top surface into the top portion.

11. The guard structure according to claim 10, wherein each of the first and the third guard rings comprises:
    a buried layer sub-ring having the first conductivity type, and at least mainly disposed in the top portion;
    a deep well sub-ring having the first conductivity type, and disposed on the buried layer sub-ring;
    a doped well sub-ring having the first conductivity type, and disposed between the top surface and the deep well sub-ring; and
    a pick-up sub-ring having the first conductivity type, and disposed in the doped well sub-ring.

12. The guard structure according to claim 11, wherein the buried layer sub-ring is heavily doped;
the deep well sub-ring is doped lighter than the buried layer sub-ring and heavier than the doped well sub-ring; and
the pick-up sub-ring is heavily doped.

13. The guard structure according to claim 10, wherein each of the second and the fourth guard rings includes:
a buried layer sub-ring having the second conductivity type, and at least mainly disposed in the top portion;
a buried layer sub-ring having the second conductivity type, and disposed on the buried well sub-ring;
a doped well sub-ring having the second conductivity type, and disposed between the top surface and the buried layer sub-ring; and
a pick-up sub-ring having the second conductivity type, and disposed in the doped well sub-ring.

14. The guard structure according to claim 13, wherein the buried layer sub-ring is heavily doped;
the buried well sub-ring is doped lighter than the buried layer sub-ring and heavier than the doped well sub-ring; and
the pick-up sub-ring is heavily doped.

15. A guard structure for a semiconductor structure, comprising:
a first guard ring having a first conductivity type;
a second guard ring having a second conductivity type, and surrounding the first guard ring;
a third guard ring having the first conductivity type, and surrounding the second guard ring;
wherein the first guard ring, the second guard ring, and the third guard ring comprising at least an upper portion, a middle portion and a lower portion, the lower portion further comprising a first portion and a second portion;
at least one of the first guard ring, the second guard ring, and the third guard ring having a lower dopant concentration in the middle portion relative to the upper portion and the lower portion; and
at least one of the first guard ring, the second guard ring, and the third guard ring having a higher dopant concentration in the first portion relative to the second portion and the middle portion, and wherein the first portion is between the second portion and the middle portion.

16. The guard structure according to claim 15, wherein the semiconductor structure comprises:
a semiconductor substrate including the first conductivity type, a substrate layer and an epitaxial layer disposed over the substrate layer, wherein the substrate layer includes a top portion, and the epitaxial layer includes a top surface; and
a device region disposed in the semiconductor substrate, and surrounded by the first guard ring.

17. The guard structure according to claim 16, further comprising:
a doped well region disposed in the semiconductor substrate, coupled between the first guard ring and the device region, and including the first conductivity type;
a dielectric region coupled to the first guard ring, and disposed over the doped well region and a portion of the device region, wherein the first conductivity type is a P type and the second conductivity type is an N type; and
a fourth guard ring having the second conductivity type, and surrounding the third guard ring, wherein the first, the second, the third and the fourth guard rings are commonly electrically connected to a high-voltage ground.

18. The guard structure according to claim 17, wherein each of the first and the third guard rings comprises:
a buried layer sub-ring having the first conductivity type, and at least mainly disposed in the top portion;
a deep well sub-ring having the first conductivity type, and disposed on the buried layer sub-ring;
a doped well sub-ring having the first conductivity type, and disposed between the top surface and the deep well sub-ring; and
a pick-up sub-ring having the first conductivity type, and disposed in the doped well sub-ring.

19. The guard structure according to claim 18, wherein the buried layer sub-ring is heavily doped;
the deep well sub-ring is doped lighter than the buried layer sub-ring and heavier than the doped well sub-ring; and
the pick-up sub-ring is heavily doped.

20. The guard structure according to claim 17, wherein each of the second and the fourth guard rings includes:
a buried layer sub-ring having the second conductivity type, and at least mainly disposed in the top portion;
a buried layer sub-ring having the second conductivity type, and disposed on the buried well sub-ring;
a doped well sub-ring having the second conductivity type, and disposed between the top surface and the buried layer sub-ring; and
a pick-up sub-ring having the second conductivity type, and disposed in the doped well sub-ring.

* * * * *